US009837779B2

(12) United States Patent
Kawasuji et al.

(10) Patent No.: US 9,837,779 B2
(45) Date of Patent: Dec. 5, 2017

(54) LASER APPARATUS AND LASER APPARATUS MANUFACTURING METHOD

(71) Applicant: GIGAPHOTON INC., Oyama-shi, Tochigi-ken (JP)

(72) Inventors: Yasufumi Kawasuji, Oyama (JP); Hideo Hoshino, Oyama (JP)

(73) Assignee: GIGAPHOTON INC., Tochigi-ken (JP)

(*) Notice: Subject to any disclaimer, the term of this patent is extended or adjusted under 35 U.S.C. 154(b) by 923 days.

(21) Appl. No.: 14/455,719

(22) Filed: Aug. 8, 2014

(65) Prior Publication Data
US 2016/0365694 A1 Dec. 15, 2016

Related U.S. Application Data

(63) Continuation of application No. PCT/IB2013/000327, filed on Mar. 8, 2013.

(30) Foreign Application Priority Data

Mar. 29, 2012 (JP) .................................. 2012-077599
Jan. 10, 2013 (JP) .................................. 2013-002689

(51) Int. Cl.
*H01S 3/02* (2006.01)
*F16B 5/02* (2006.01)
(Continued)

(52) U.S. Cl.
CPC ................. *H01S 3/02* (2013.01); *F16B 5/02* (2013.01); *F16B 7/18* (2013.01); *F16B 41/002* (2013.01);
(Continued)

(58) Field of Classification Search
CPC .... H01S 3/02; H01S 3/025; F16B 5/02; F16B 7/18; F16B 41/002; G03F 7/70008;
(Continued)

(56) References Cited

U.S. PATENT DOCUMENTS 3,916,596 A 11/1975 Hawley
5,775,831 A * 7/1998 Mullenberg ............... F16B 2/14
403/258

(Continued)

FOREIGN PATENT DOCUMENTS

DE    EP 1892053 A2 * 2/2008 ............. B23D 33/12
DE    102011075571 A1    11/2011
(Continued)

OTHER PUBLICATIONS

An Office Action; "Notice of Reason for Rejection," issued by the Japanese Patent Office dated Jun. 21, 2016, which corresponds to Japanese Patent Application No. 2013-002689 and is related to U.S. Appl. No. 14/455,719; with English language translation.
(Continued)

*Primary Examiner* — David E Smith
(74) *Attorney, Agent, or Firm* — Studebaker & Brackett PC

(57) ABSTRACT

A laser apparatus may include, a first frame and a second frame, a sleeve through-hole provided in the second frame, a sleeve insertion hole provided in the first frame, a bolt, a positioning sleeve that is formed in an approximately cylindrical shape into which the bolt can be inserted and that positions the first frame and the second frame by passing through the sleeve through-hole and being inserted into the sleeve insertion hole, a nut that is provided in the first frame and into which the bolt is screwed, and a fall prevention unit that is provided in the second frame and that prevents the bolt and the positioning sleeve from falling.

3 Claims, 18 Drawing Sheets

(51) Int. Cl.
   *F16B 7/18*    (2006.01)
   *F16B 41/00*   (2006.01)
   *G03F 7/20*    (2006.01)
   *H05G 2/00*    (2006.01)
   *H01S 3/23*    (2006.01)

(52) U.S. Cl.
   CPC ...... *G03F 7/70008* (2013.01); *G03F 7/70025* (2013.01); *G03F 7/70833* (2013.01); *G03F 7/70975* (2013.01); *H05G 2/005* (2013.01); *H05G 2/008* (2013.01); *H01S 3/2316* (2013.01)

(58) Field of Classification Search
   CPC ............ G03F 7/70025; G03F 7/70833; G03F 7/70975; G03F 7/70925; H05G 2/005; H05G 2/008
   See application file for complete search history.

(56) References Cited

U.S. PATENT DOCUMENTS

| | | | |
|---|---|---|---|
| 7,874,777 | B1 | 1/2011 | Howie, Jr. |
| 8,112,843 | B2 | 2/2012 | Greiner et al. |
| 2004/0182842 | A1* | 9/2004 | Denney ............... B23K 26/032 219/121.84 |
| 2009/0297261 | A1 | 12/2009 | Mons |
| 2012/0063104 | A1 | 3/2012 | Moser et al. |

FOREIGN PATENT DOCUMENTS

| | | | |
|---|---|---|---|
| EP | 0614329 | A1 | 9/1994 |
| EP | 0783120 | A2 * | 7/1997 ............... G02B 7/00 |
| EP | 1262670 | A2 | 12/2002 |
| FR | 2741405 | A1 | 5/1997 |
| FR | 2936846 | A1 | 4/2010 |
| GB | 1356052 | A | 6/1974 |
| WO | 99-60679 | A1 | 11/1999 |

OTHER PUBLICATIONS

An Office Action; "Notice of Grounds for Rejection," issued by the Japanese Patent Office dated Nov. 8, 2016, which corresponds to Japanese Patent Application No. 2013-002689 and is related to U.S. Appl. No. 14/455,719; with English language translation.

International Preliminary Report on Patentability PCT/IB2013/000327 dated Oct. 1, 2014.

An Office Action; "Notice of Examination Opinions," issued by the Taiwanese Patent Office dated Dec. 15, 2016, which corresponds to Taiwanese Patent Application No. 102110646 and is related to U.S. Appl. No. 14/455,719; with English language translation.

International Search Report and Written Opinion issued in PCT/IB2013/000327, dated Oct. 14, 2013.

* cited by examiner

LASER APPARATUS AND LASER APPARATUS MANUFACTURING METHOD

CROSS-REFERENCE TO RELATED APPLICATIONS

The present application is a continuation of PCT/IB2013/000327, filed on Mar. 8, 2013, which in turn claims priority from Japanese Patent Application No. 2012-077599, filed Mar. 29, 2012, and, Japanese Patent Application No. 2013-002689, filed Jan. 10, 2013, the disclosures of which Applications are incorporated by reference herein.

BACKGROUND

1. Technical Field

The present disclosure relates to laser apparatuses and laser apparatus manufacturing methods.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A laser apparatus according to an aspect of the present disclosure may include a laser system, a pair of frames, one frame being provided with a sleeve through-hole and the other fame being provided with a sleeve insertion portion, a sleeve through-hole provided in one frame, a sleeve insertion portion provided in the other frame, a bolt, a positioning sleeve, formed in an approximately cylindrical shape into the interior of which the bolt can be inserted, configured to position the pair of frames by passing through the sleeve through-hole and being inserted into the sleeve insertion portion, a female screw portion, provided in the other frames, into which the bolt is screwed, and a fall prevention unit, provided in the one frames, configured to prevent the bolt and the positioning sleeve from falling.

A laser apparatus manufacturing method according to another aspect of the present disclosure may include connecting a pair of frames, of a plurality of laser system modules that configure a laser system, mounting some of the laser system modules in one of the frames and mounting some other of the laser system modules in the other of the frames, positioning the laser system modules mounted in the pair of frames relative to each other, separating the pair of frames, transporting the separated pair of frames, and reconnecting the transported pair of frames.

BRIEF DESCRIPTION OF THE DRAWINGS

Hereinafter, selected embodiments of the present disclosure will be described with reference to the accompanying drawings.

DETAILED DESCRIPTION

Figure 1:
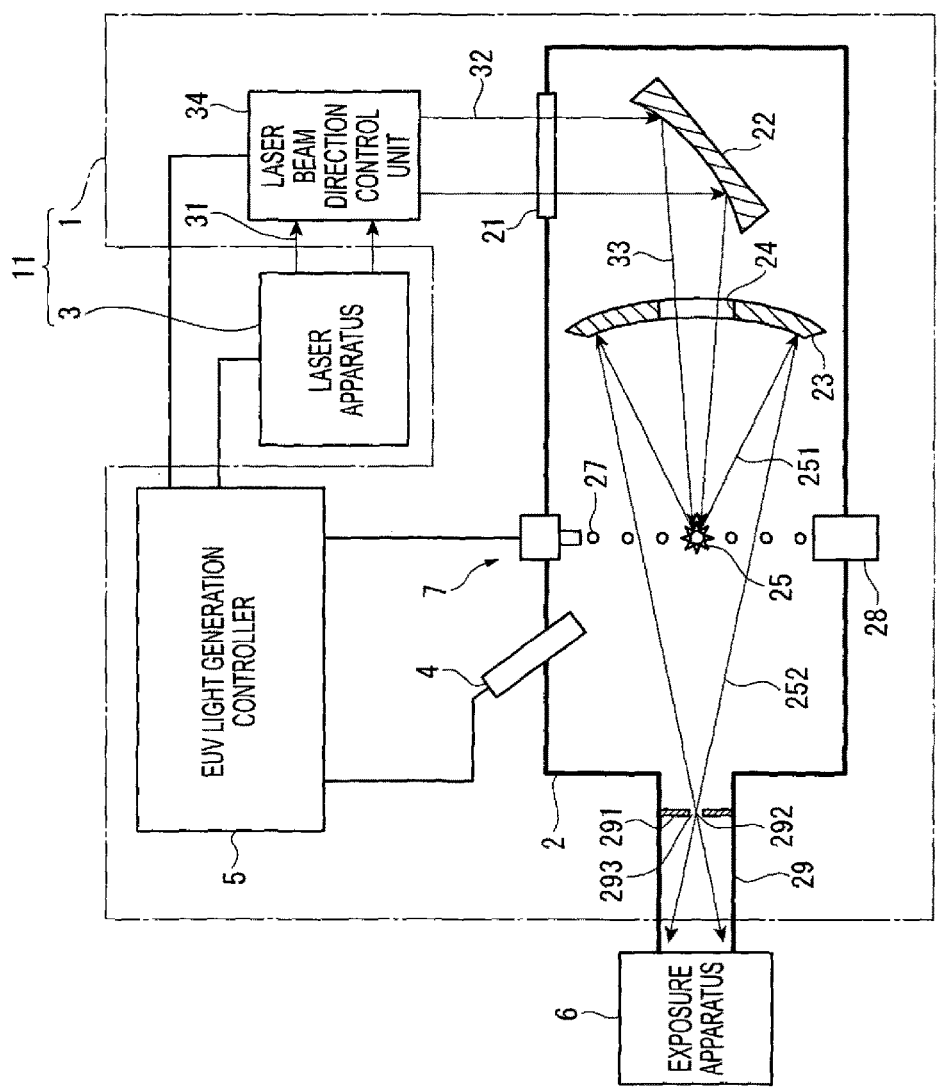
FIG. 1 illustrates an overall configuration of an exemplary LPP-type EUV light generation apparatus.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents

1. Overview

2. Overall Description of EUV Light Generation Apparatus 2.1 Configuration 2.2 Operation 3. EUV Light Generation Apparatus Including Laser Apparatus
3.1 Terms
3.2 First Embodiment
3.2.1 Overview
3.2.2 Configuration
3.2.2.1 Configuration of Laser Apparatus
3.2.2.2 Module Arrangement
3.2.2.3 Structure of Connecting Portions
3.2.3 Operation
3.2.3.1 Assembly of Laser Apparatus Housing
3.2.3.2 Mounting of First to Fourth Laser System Modules in Laser Apparatus Housing and Laser Apparatus Adjustment
3.2.3.3 Breakdown of Laser Apparatus Housing
3.2.3.4 Transport of Laser Apparatus
3.2.3.5 Reconnecting of Laser Apparatus Housing
3.3 Second Embodiment
3.3.1 Overview
3.3.2 Configuration
3.3.3 Operation
3.3.3.1 Breakdown of Laser Apparatus Housing
3.3.3.2 Transport of Laser Apparatus
3.3.3.3 Reconnecting of Laser Apparatus Housing
3.4 Third Embodiment
3.4.1 Overview
3.4.2 Configuration
3.4.3 Operation
3.4.3.1 Breakdown of Laser Apparatus Housing
3.4.3.2 Transport of Laser Apparatus
3.4.3.3 Reconnecting of Laser Apparatus Housing
3.5 Fourth Embodiment
3.5.1 Overview
3.5.2 Configuration
3.5.3 Operation
3.5.3.1 Assembly of Laser Apparatus Housing
3.5.3.2 Reconnecting of Laser Apparatus Housing
3.6 Fifth Embodiment
3.6.1 Overview
3.6.2 Configuration
3.6.3 Operation
3.6.3.1 Breakdown of Laser Apparatus Housing
3.6.3.2 Transport of Laser Apparatus
3.6.3.3 Reconnecting of Laser Apparatus Housing
3.7 Variations
3.7.1 First Variation
3.7.2 Second Variation
3.7.3 Third Variation
3.7.4 Fourth Variation 1. Overview According to an embodiment of the present disclosure, a laser apparatus may include a pair of frames, a sleeve through-hole provided in one of the frames, a sleeve insertion portion provided in the other of the frames, a bolt, a positioning sleeve, formed in an approximately cylindrical shape into the interior of which the bolt can be inserted, configured to position the pair of frames by passing through the sleeve through-hole and being inserted into the sleeve insertion portion, a female screw portion, provided in the other of the frames, into which the bolt is screwed, and a fall prevention unit, provided in the one of the frames, configured to prevent the bolt and the positioning sleeve from falling.

Here, in a case where the laser apparatus is to be manufactured, a worker can perform a manufacturing operation using, for example, the steps described hereinafter.

First, the worker may mount the laser system modules in the respective frames in the pair of frames after positioning the pair of frames and connecting the frames at, for example, a factory. Next, the worker may position the laser system modules relative to each other, and may then separate the pair of frames in which the positioned laser system modules are mounted. After this, the worker may transport the separated pair of frames to an installation site of the laser apparatus (for example, a clean room), reconnect the pair of frames at the installation site, and complete the manufacture of the laser apparatus.

During such operations, when the pair of frames are connected at the installation site, the laser system modules are mounted in the respective frames, and it can thus be difficult for the worker to enter the frames and carry out the connecting operations. Accordingly, the worker can be forced to perform the connecting operations from a location that is outside of the frame and that is distanced from the areas of connection. When connecting the pair of frames, positioning the pair of frames using bolts that pass through the pair of frames and tightening the bolts into female screw portions can be considered. However, it can be difficult, for a worker in a location that is distanced from the areas of connection, to transport the bolts to the areas of connection using a transport member such as a tool or the like and carry out operations for passing the bolts through the pair of frames and tightening the bolts into the female screw portions.

According to an embodiment of the present disclosure, the pair of frames may be positioned by passing a positioning sleeve through a sleeve through-hole and inserting the positioning sleeve into a sleeve insertion portion.

By using the positioning sleeve to position the pair of frames and using the bolt in the tightening in this manner, a problem in which a male screw portion of the bolt collapses when positioning the pair of frames in the case where the bolt is used for both the positioning and the tightening can be suppressed.

In addition, a fall prevention unit that prevents the positioning sleeve and the bolt from falling may be provided in one of the frames.

According to this configuration, the positioning sleeve and the bolt can be prevented from falling while the frame is being transported, and the positioning sleeve and the bolt can be held in a location that is close to the areas of connection in the frame. Accordingly, even in a case where it is necessary for the worker to perform connection operations from a position that is outside of the frame and distanced from the areas of connection, it can be made unnecessary to perform operations for conveying the bolt and the positioning sleeve to those areas of connection. Accordingly, the worker can easily position the pair of frames using the positioning sleeve and can tighten the bolt into the female screw portion using, for example, a long tool that reaches the areas of connection.

According to an embodiment of the present disclosure, a laser apparatus manufacturing method may include connecting a pair of frames, of a plurality of laser system modules that configure a laser system, mounting some of the laser system modules in one of the frames and mounting some other of the laser system modules in the other of the frames, positioning the laser system modules mounted in the pair of frames relative to each other, separating the pair of frames, transporting the separated pair of frames, and reconnecting the transported pair of frames.

According to this embodiment of the present disclosure, even in a case where the overall size of the laser apparatus is large and cannot pass through a path to an installation site, transporting the frames individually can make it possible to convey the laser apparatus through the path to the installation site. In addition, because the laser system modules are positioned relative to each other prior to transport, all that is necessary is to reconnect the frames at the installation site, and it can thus be made unnecessary to reposition the laser system modules at the installation site. Accordingly, the number of operations and operation time at the installation site can be reduced.

2. Overview of EUV Light Generation System

2.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 7. The chamber 2 may be sealed airtight. The target supply device 7 may be mounted onto the chamber 2, for example, to penetrate a wall of the chamber 2. A target material to be supplied by the target supply device 7 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 7 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

3. EUV Light Generation Apparatus Including Laser Apparatus

3.1 Terms

Figure 3:
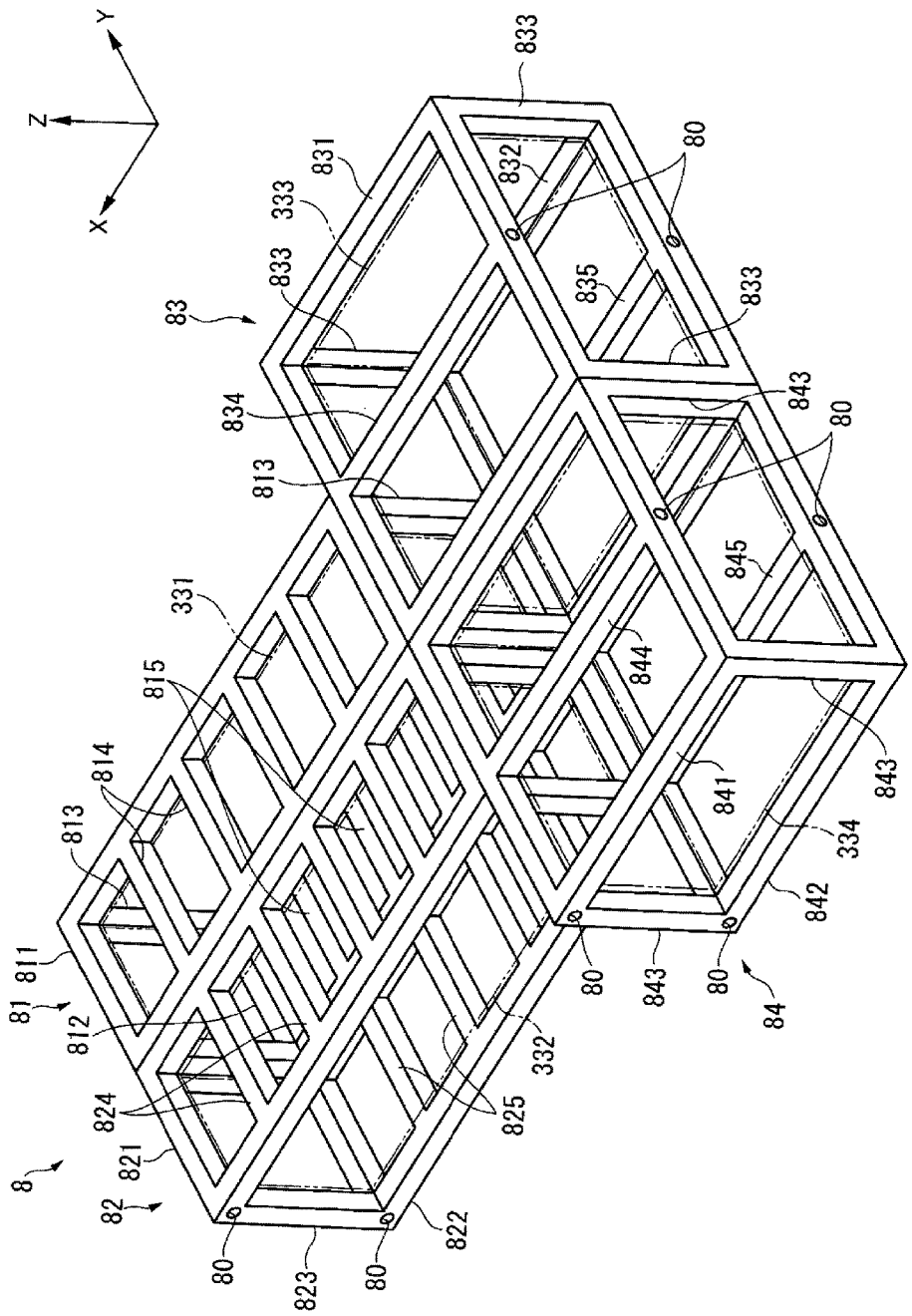
FIG. 3 is a perspective view illustrating a frame according to a first embodiment.

Hereinafter, there are cases where an upward direction and a downward direction relative to the paper surface in FIG. 3 are expressed as a +Z direction and a −Z direction, respectively, where an upward-left diagonal direction and a downward-right diagonal direction are expressed as a +X direction and a −X direction, respectively, and where an upward-right diagonal direction and a downward-left diagonal direction are expressed as a +Y direction and a −Y direction, respectively. In addition, there are cases where the +Z direction and the −Z direction directions are collectively referred to as a Z direction, where the +X direction and the −X direction are collectively referred to as an X direction, and where the +Y direction and the −Y direction are collectively referred to as a Y direction. Directions may also be expressed using the coordinate system illustrated in FIG. 3 in FIGS. 14 through 18 as well.

Note that these expressions are unrelated to a gravitational direction 10B that follows the −Z direction.

3.2 First Embodiment

3.2.1 Overview

According to a first embodiment of the present disclosure, a positioning sleeve for a laser apparatus may include a cylindrical portion and a peripheral edge contact portion that projects from a rear end of the outer peripheral surface of the cylindrical portion in the direction of the through-hole and that is capable of making contact with the peripheral edge of the sleeve through-hole.

With a laser apparatus according to the embodiment, the peripheral edge contact portion makes contact with the peripheral edge of the sleeve through-hole, and thus the positioning sleeve can be prevented from being pushed too far into the other frame. Accordingly, it can be made unnecessary to perform fine adjustments on the amount to which the positioning sleeve is pushed in.

According to the first embodiment, a fall prevention unit of the laser apparatus may include a bolt loss prevention portion that prevents a bolt from coming off from the sleeve through-hole.

According to the embodiment, the bolt can be prevented from coming off from the sleeve through-hole by the bolt loss prevention portion. Accordingly, when reconnecting a pair of frames at an installation site, it can be made unnecessary to perform an operation for passing the bolt through the sleeve through-hole.

3.2.2 Configuration
3.2.2.1 Configuration of Laser Apparatus

Figure 2:
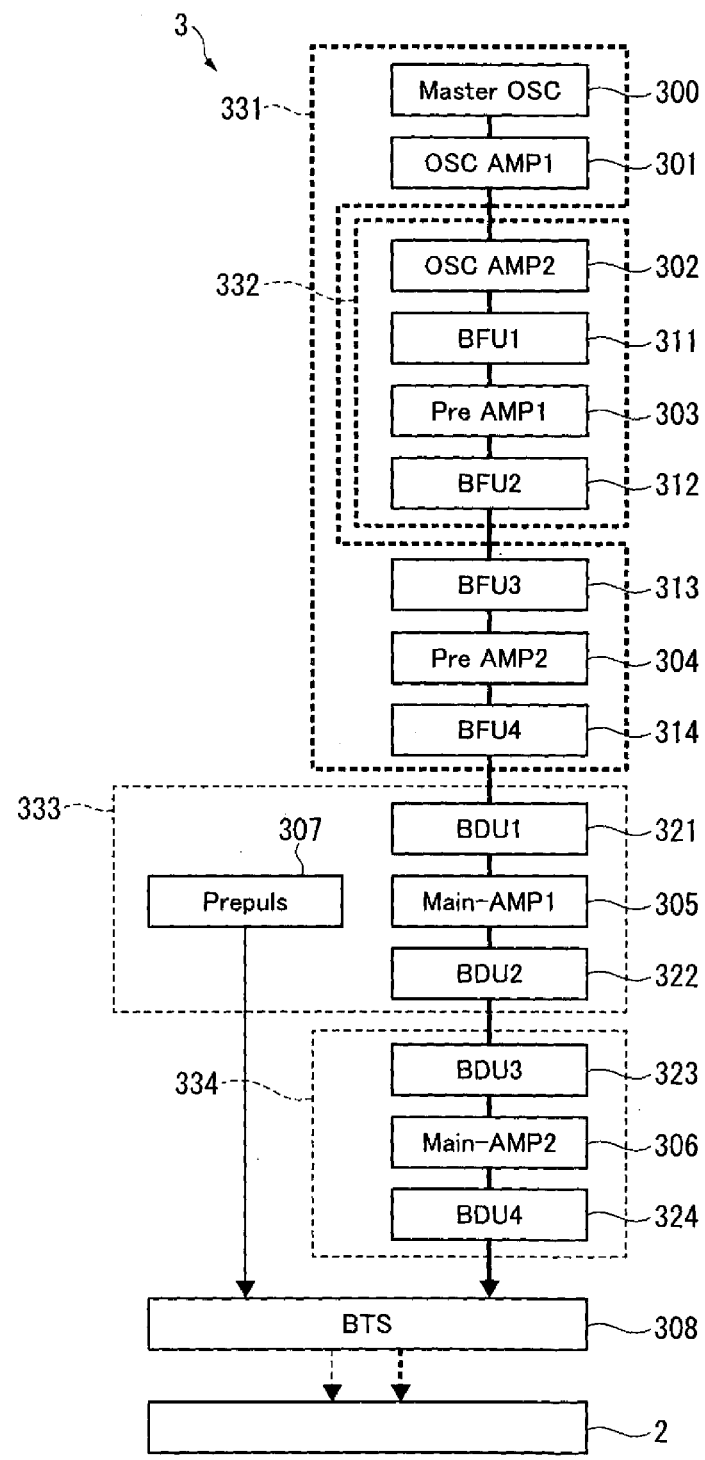
FIG. 2 is a block diagram illustrating an overview of a configuration of a laser apparatus.

FIG. 2 is a block diagram illustrating an overview of a configuration of the laser apparatus.

A laser apparatus 3 included in an EUV light generation system 11 such as that shown in FIG. 1 may include, as shown in FIG. 2, a master oscillator 300, a first master oscillator amplifier 301, a second master oscillator amplifier 302, a first preamplifier 303, a second preamplifier 304, a first main amplifier 305, a second main amplifier 306, a pre-pulse laser 307, and a beam transport system 308.

The master oscillator 300 (oscillator) may be configured using, for example, a semiconductor laser device, a CO2 laser apparatus, or the like. The master oscillator 300 may be configured to generate a main pulse laser beam seed light. The main pulse laser beam can turn a target (not shown) into plasma by striking the target.

The first master oscillator amplifier 301, the second master oscillator amplifier 302, the first preamplifier 303, the second preamplifier 304, the first main amplifier 305, and the second main amplifier 306 may be disposed downstream from the master oscillator 300 in that order. The first and second master oscillator amplifiers 301 and 302, the first and second preamplifiers 303 and 304, and the first and second main amplifiers 305 and 306 may be configured to sequentially amplify the main pulse laser beam seed light generated by the master oscillator 300 and output that light to the beam transport system 308.

The first and second master oscillator amplifiers 301 and 302 and the first and second preamplifiers 303 and 304 may be configured as, for example, slab amplifiers. The first and second main amplifiers 305 and 306 may each be configured as, for example, fast axial flow amplifiers.

A first beam forming module 311 and a second beam forming module 312 may be disposed upstream and downstream, respectively, from the first preamplifier 303. A third beam forming module 313 may be disposed upstream from the second preamplifier 304 and downstream from the second beam forming module 312. A fourth beam forming module 314 may be disposed downstream from the second preamplifier 304.

The first to fourth beam forming modules 311 to 314 may form light emitted from a previous stage and output the formed light to a latter stage.

A first beam delivery module 321 may be disposed upstream from the first main amplifier 305 and downstream from the fourth beam forming module 314. A second beam delivery module 322 may be disposed downstream from the first main amplifier 305. A third beam delivery module 323 may be disposed upstream from the second main amplifier 306 and downstream from the second beam delivery module 322. A fourth beam delivery module 324 may be disposed downstream from the second main amplifier 306.

The first to third beam delivery modules 321 to 323 may deliver light emitted from a previous stage to an entering position in a latter stage. The fourth beam delivery module 324 may deliver light emitted from the second main amplifier 306 (main pulse laser beam) to an entering position for the beam transport system 308.

The pre-pulse laser 307 can output a pre-pulse laser beam. The pre-pulse laser beam diffuses a droplet 27 (see FIG. 1) by striking the droplet 27. An absorption rate of the main pulse laser beam for the target can be increased by the target being diffused.

The pre-pulse laser beam outputted from the pre-pulse laser 307 may enter the beam transport system 308. The main pulse laser beam and the pre-pulse laser beam that have entered the beam transport system 308 may enter a chamber 2.

3.2.2.2 Module Arrangement

Figure 4:
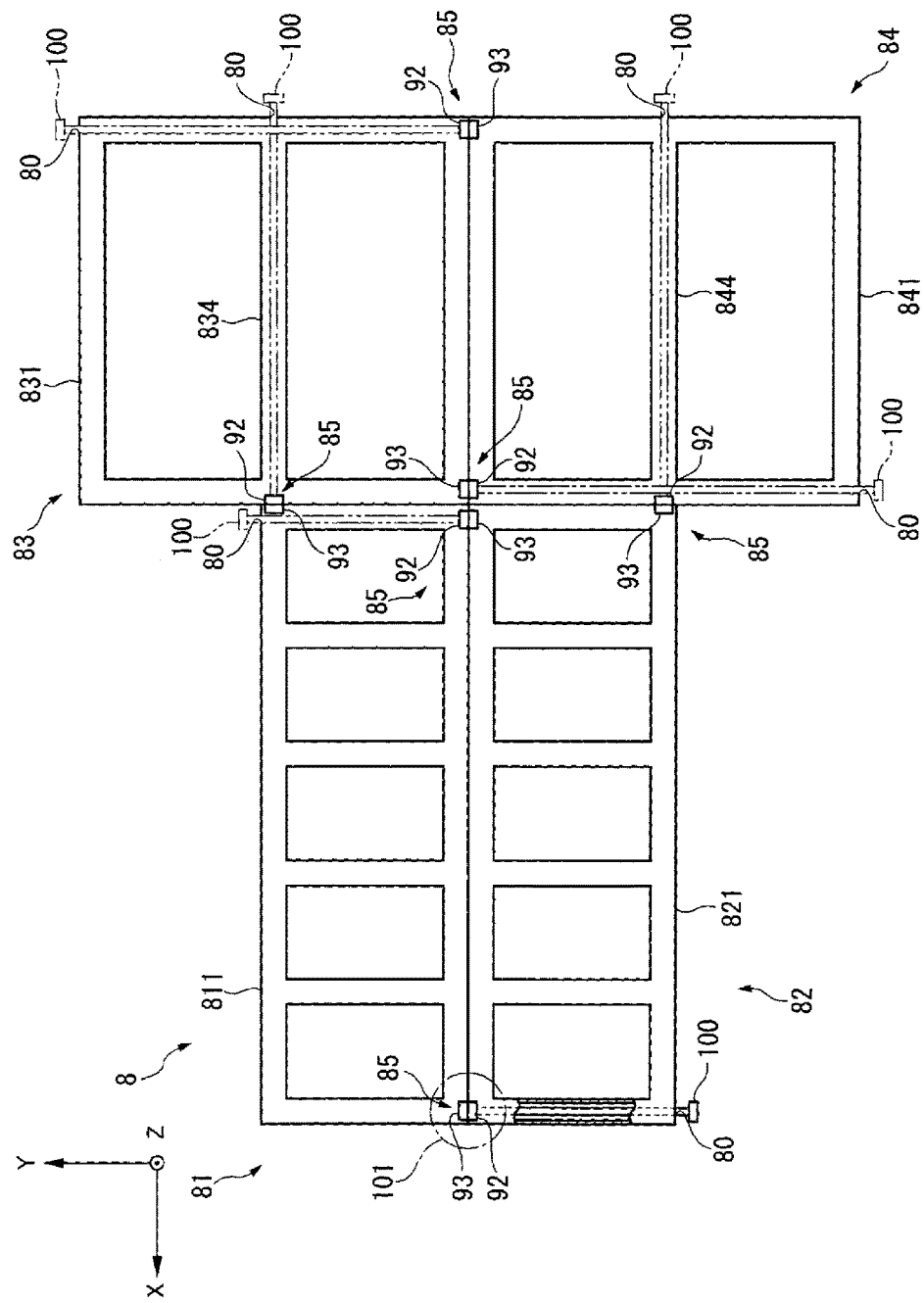
FIG. 4 is a plan view illustrating the frame from a +Z direction.
Figure 5:
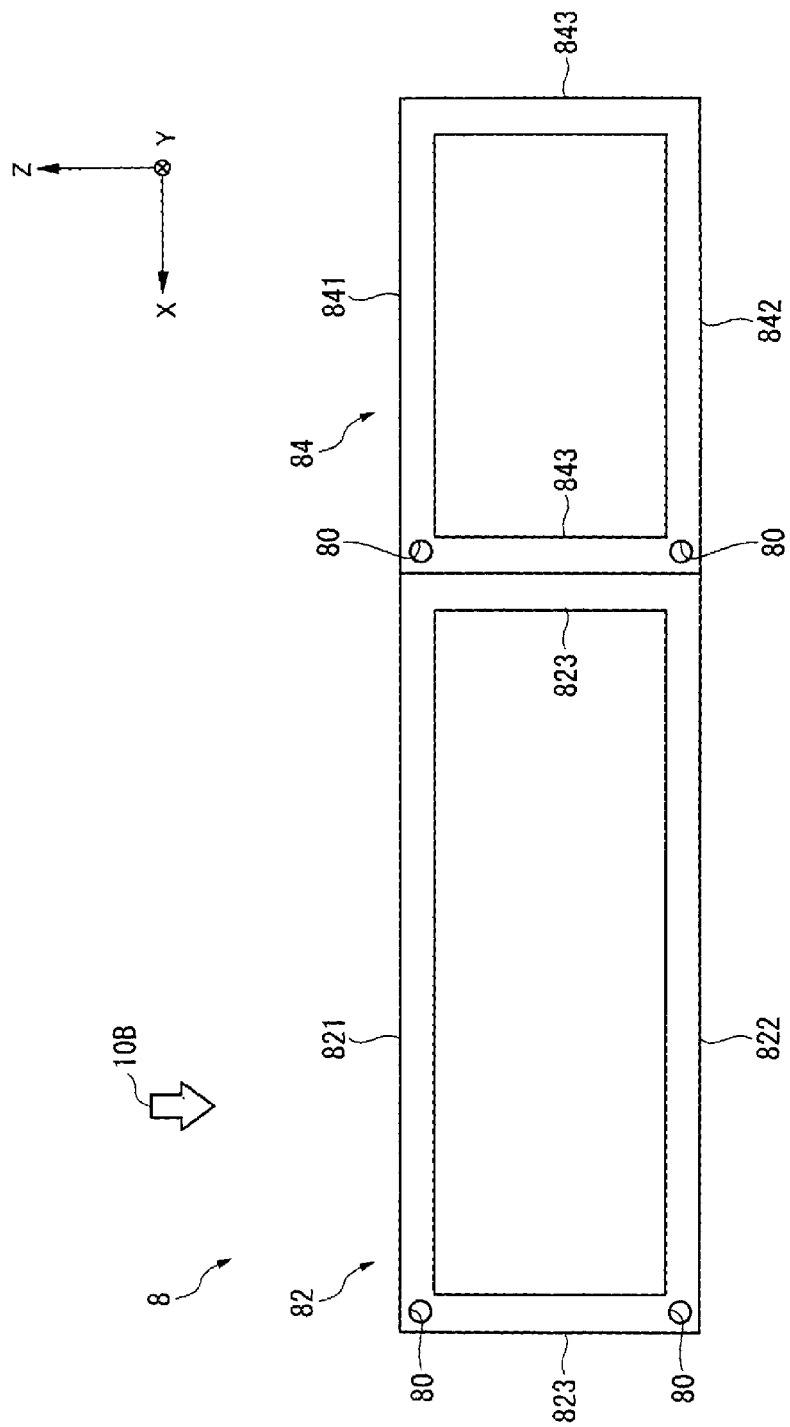
FIG. 5 is a side surface view illustrating the frame from a −Y direction.

FIG. 3 is a perspective view illustrating frames. FIG. 4 is a plan view illustrating the frames from the +Z direction. FIG. 5 is a side surface view illustrating the frames from the −Y direction.

The laser apparatus 3 illustrated in FIG. 2 may be housed in a laser apparatus housing 8 such as that shown in FIG. 3. The laser apparatus housing 8 may be configured by connecting a first frame 81, a second frame 82, a third frame 83, and a fourth frame 84. The sizes of the first to fourth frames 81 to 84 may be set to sizes that can pass through device transport paths in typical semiconductor factories or the like without interference. The sizes may also be set to sizes capable of fitting within container chambers in airplanes and being transported by air.

At least one part each of a first laser system module 331, a second laser system module 332, a third laser system module 333, and a fourth laser system module 334 may be housed within the first frame 81, the second frame 82, the third frame 83, and the fourth frame 84, respectively, in the regions indicated by the double-dot-dash line in FIG. 3.

As indicated as an example in FIG. 2, the first laser system module 331 may include the master oscillator 300, the first master oscillator amplifier 301, the third beam forming module 313, the second preamplifier 304, and the fourth beam forming module 314. The second laser system module 332 may include the second master oscillator amplifier 302, the first beam forming module 311, the first preamplifier 303, and the second beam forming module 312. The third laser system module 333 may include the first beam delivery module 321, the first main amplifier 305, the second beam delivery module 322, and the pre-pulse laser 307. The fourth laser system module 334 may include the third beam delivery module 323, the second main amplifier 306, and the fourth beam delivery module 324.

The first frame 81 may be formed in an approximately rectangular parallelpiped shape by connecting approximately square-shaped hollow members made of a metal, such as square pipes or the like, through welding or the like. The first frame 81 may include an approximately rectangular upper frame 811, a lower frame 812 having the same shape as the upper frame 811, and four columns 813 that connect the corner portions of the upper frame 811 and the lower frame 812, respectively, to each other. A reinforcement 814 and a reinforcement 815 that connect mutually-opposing pairs of the approximately square-shaped hollow members to each other may be bonded to the upper frame 811 and the lower frame 812.

The third frame 83 may be formed in an approximately rectangular parallelpiped shape by connecting approximately square-shaped hollow members made of a metal, such as square pipes or the like, through welding or the like. The third frame 83 may include an approximately square upper frame 831, a lower frame 832 having the same shape as the upper frame 831, and four columns 833 that connect the corner portions of the upper frame 831 and the lower frame 832, respectively, to each other. A reinforcement 834 and a reinforcement 835 that connect mutually-opposing pairs of the approximately square-shaped hollow members to each other may be bonded to the upper frame 831 and the lower frame 832.

The second and fourth frames 82 and 84 may have the same configurations as the first and third frames 81 and 83, respectively, and may include upper frames 821 and 841, lower frames 822 and 842, columns 823 and 843, reinforcements 824 and 844, and reinforcements 825 and 845, respectively.

The first frame 81 and the second frame 82 may, as shown in FIG. 4, be connected snugly to each other on the side surfaces thereof corresponding to the long sides when viewed from above. The third frame 83 and the fourth frame 84 may be connected so that side surfaces thereof are snug with each other. The first frame 81 and third frame 83 and the second frame 82 and fourth frame 84 may be linked so that, when viewed from above, side surfaces corresponding to short sides of the first frame 81 and the second frame 82 and side surfaces of the third frame 83 and the fourth frame 84 are snug with each other.

The first frame 81 and second frame 82, the third frame 83 and fourth frame 84, the first frame 81 and third frame 83, and the second frame 82 and fourth frame 84 may be connected by respective connecting portions 85.

The connecting portions 85 for connecting the first frame 81 and the second frame 82 may, as shown in FIGS. 4 and 5, be provided at four corner areas where mutually opposing side surfaces are located. Note that the connecting portions 85 may be provided in other locations as well as long as those locations are capable of connecting the first frame 81 and the second frame 82.

As shown in FIG. 4, operations for connecting these four connecting portions 85 may be performed using a tool 100 that is inserted into the upper frame 821 and the lower frame 822, respectively, via tool holes 80, from the −Y direction toward the +Y direction. As indicated by the double-dot-dash lines in FIG. 4, operations for connecting the other connecting portions 85 may be performed using the tool 100 that is inserted into the upper frame 811 and the lower frame 812, respectively, via the tool holes 80, from the +Y direction toward the −Y direction. The tool 100 may be a hexagonal wrench. It is preferable for the tool 100 to be a torque wrench so that the torque can be managed.

The connecting portions 85 for connecting the third frame 83 and the fourth frame 84 may be provided at four corner areas where mutually opposing side surfaces are located.

As indicated by the double-dot-dash lines in FIG. 4, operations for connecting these four connecting portions 85 may be performed using the tool 100 that is inserted into the upper frame 841 and the lower frame 842, respectively, via tool holes 80, from the −Y direction toward the +Y direction. As indicated by the double-dot-dash lines in FIG. 4, operations for connecting the other connecting portions 85 may be performed using the tool 100 that is inserted into the upper frame 831 and the lower frame 832, respectively, via the tool holes 80, from the +Y direction toward the −Y direction.

The connecting portions 85 for connecting the first frame 81 and the third frame 83, and the connecting portions 85 for connecting the second frame 82 and the fourth frame 84, may be provided in two locations (upper and lower) on mutually opposing side surfaces. As indicated by the double-dot-dash lines in FIG. 4, operations for connecting these four connecting portions 85 may be performed using the tool 100 that is inserted into the reinforcements 834, 835, 844, and 845, respectively, via tool holes 80, from the −X direction toward the +X direction.

3.2.2.3 Structure of Connecting Portions

Figure 6:
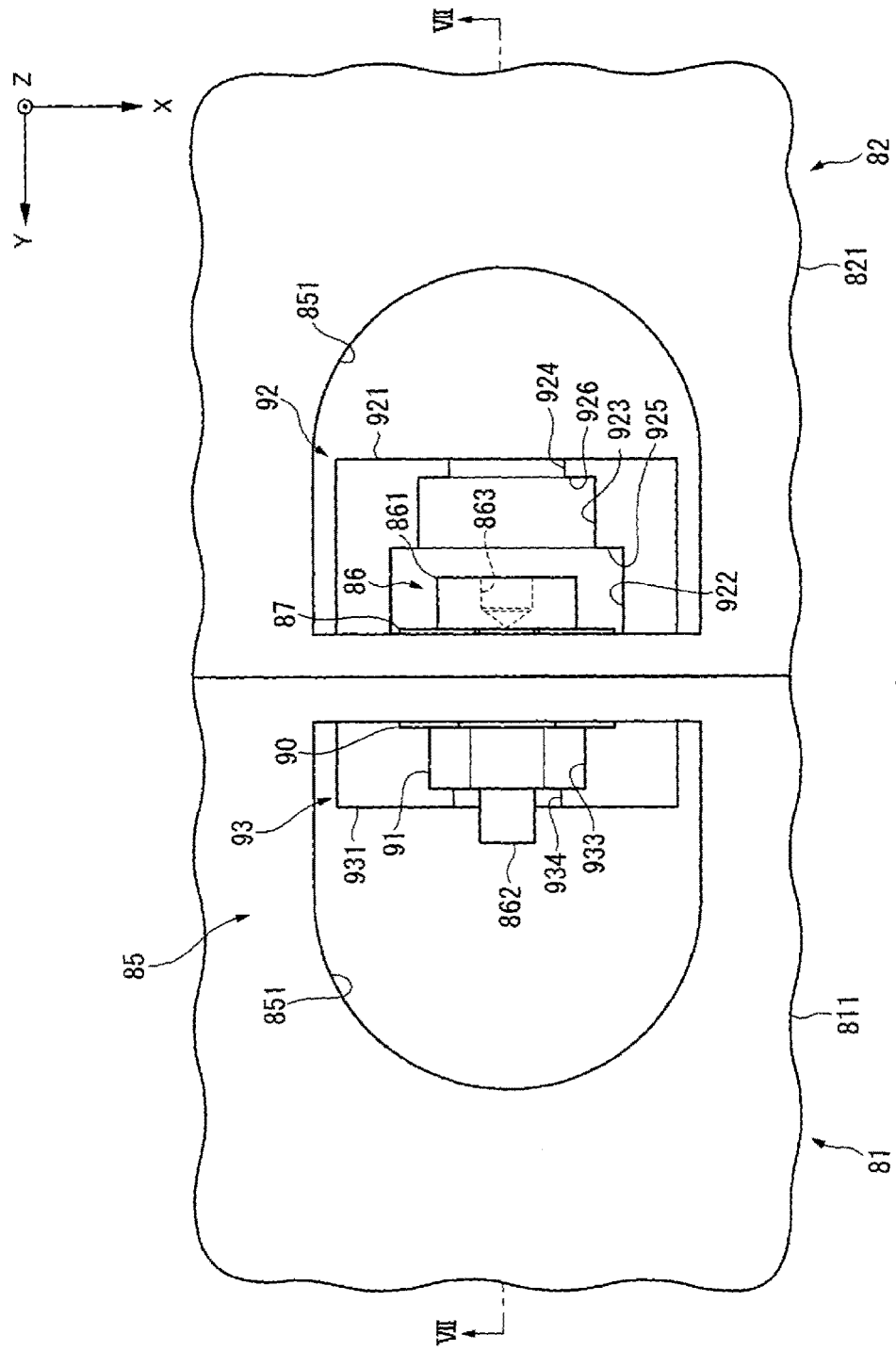
FIG. 6 is a plan view showing an enlarged view of a connecting portion.
Figure 7:
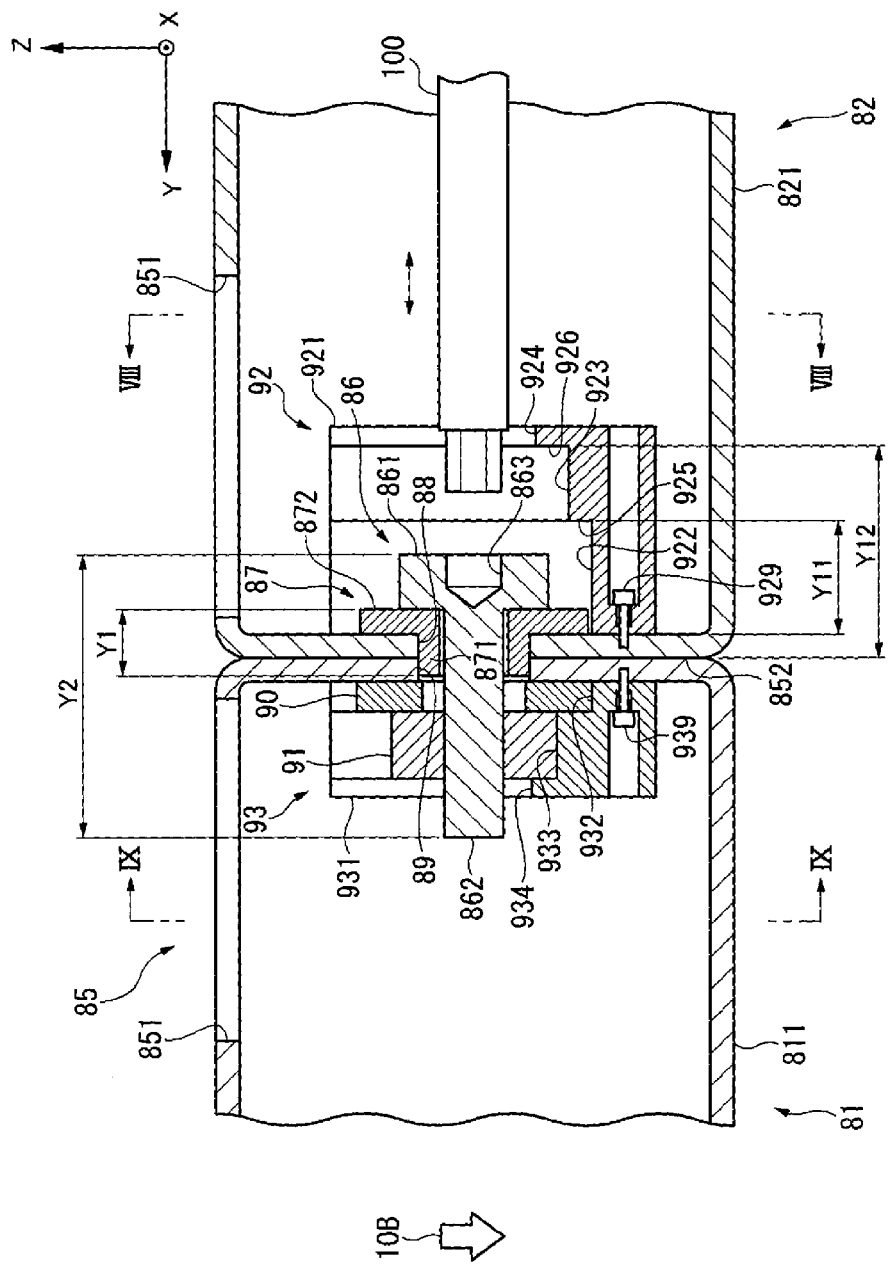
FIG. 7 is a sectional view taken along VII-VII line shown in FIG. 6.
Figure 8:
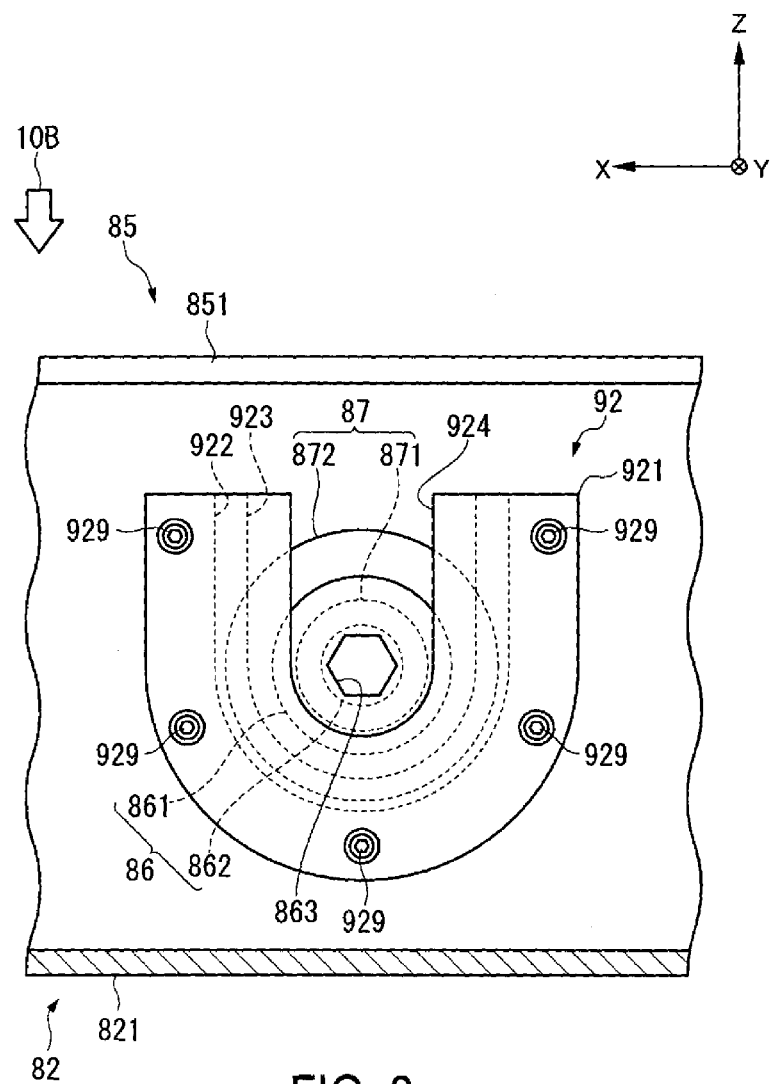
FIG. 8 is a sectional view taken along VIII-VIII line shown in FIG. 7.
Figure 9:
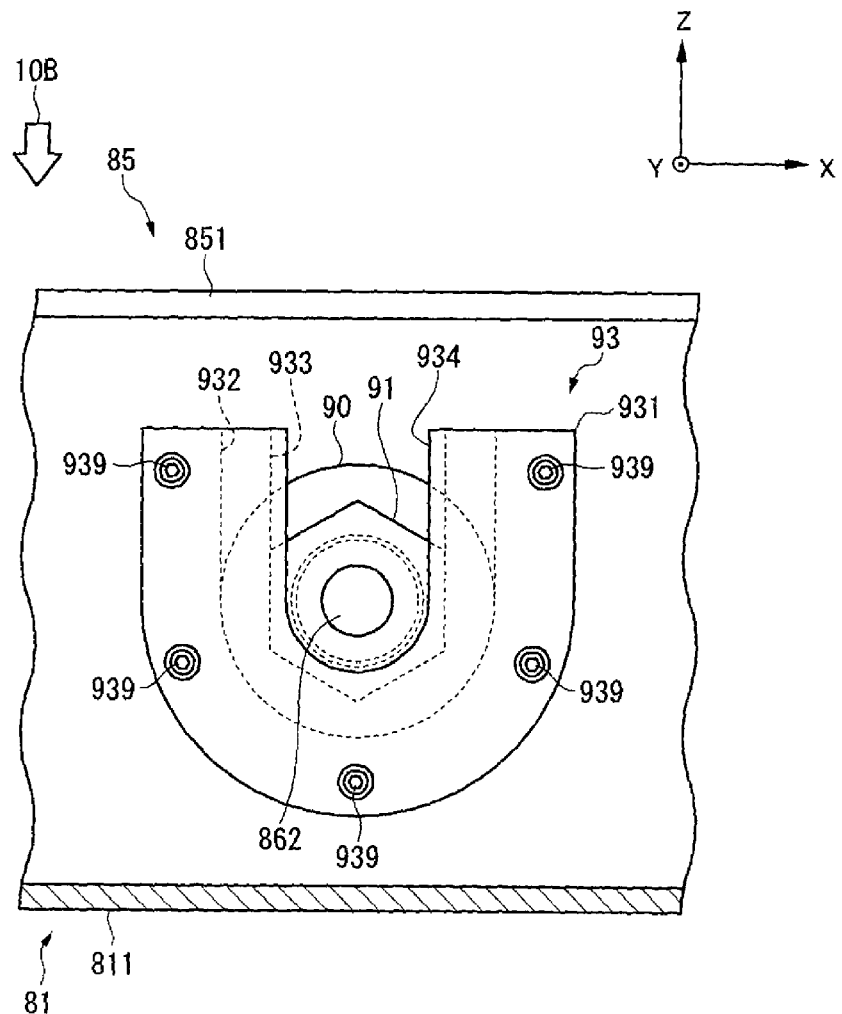
FIG. 9 is a sectional view taken along IX-IX line shown in FIG. 7.

FIG. 6 is a plan view showing an enlarged view of the connecting portion. FIG. 7 is a sectional view taken along VII-VII line shown in FIG. 6. FIG. 8 is a sectional view taken along VIII-VIII line shown in FIG. 7. FIG. 9 is a sectional view taken along IX-IX line shown in FIG. 7.

Note that FIGS. 6 through 9 may illustrate the connecting portion 85 for connecting the first frame 81 and the second frame 82, at the circular area indicated by reference numeral 101 in FIG. 4. The connecting portions 85 for connecting the first frame 81 and the second frame 82, the third frame 83 and the fourth frame 84, the first frame 81 and the third frame 83, and the second frame 82 and the fourth frame 84 at the areas not indicated by the reference numeral 101 may have configurations corresponding to those illustrated in FIGS. 6 through 9.

A cutout portion 851 that allows the interior and the exterior of the upper frame 811 to communicate may be provided in the upper surface of the upper frame 811 in the first frame 81. The cutout portion 851 may be provided in the upper surface of the upper frame 821 in the second frame 82. The size of the opening of the cutout portion 851 may be a size at which a worker can insert his/her hand and perform operations therein.

The connecting portion 85 may include a bolt 86, a positioning sleeve 87, a sleeve through-hole 88, a sleeve insertion hole 89 serving as a sleeve insertion portion, a washer 90, a nut 91 serving as a female screw portion, a fall prevention unit 92, and a holding unit 93.

The bolt 86 may include a bolt head 861 and a male screw portion 862. A tool groove 863 into which the tool 100 can be fitted may be provided in the bolt head 861.

The positioning sleeve 87 may be formed of a metal. The positioning sleeve 87 may include a cylindrical portion 871 and a peripheral edge contact portion 872.

The cylindrical portion 871 may be formed in a circular barrel shape. An outer diameter dimension of the cylindrical portion 871 may be of a size that is essentially the same as an inner diameter dimension of the sleeve through-hole 88 and the sleeve insertion hole 89. In other words, the cylindrical portion 871 may be configured to enable the first frame 81 and the second frame 82 to be positioned by being passed through the sleeve through-hole 88 and inserted into the sleeve insertion hole 89. The inner diameter dimension of the cylindrical portion 871 may be greater than the outer diameter dimension of the male screw portion 862 of the bolt 86. Through this, the male screw portion 862 of the bolt 86 can be inserted into the cylindrical portion 871.

The peripheral edge contact portion 872 may be provided to protrude outward in the radial direction of the cylindrical portion 871 from a trailing end, in the direction in which the cylindrical portion 871 passes through (that is, one end in the axial direction of the cylindrical portion 871), of the outer circumferential surface of the cylindrical portion 871. The peripheral edge contact portion 872 may be provided continuously along the outer circumferential direction of the cylindrical portion 871. The peripheral edge contact portion 872 may instead be provided intermittently along the outer circumferential direction of the cylindrical portion 871. The peripheral edge contact portion 872 may be configured so that when the cylindrical portion 871 is inserted into the sleeve through-hole 88 and the sleeve insertion hole 89, the peripheral edge contact portion 872 makes contact with the peripheral edge of the sleeve through-hole 88, so that the entire positioning sleeve 87 is not pushed into the second frame. Meanwhile, the peripheral edge contact portion 872 may be provided so that a leading end of the cylindrical portion 871 does not protrude into the upper frame 821 from the sleeve insertion hole 89 upon making contact with the peripheral edge of the sleeve through-hole 88.

The sleeve through-hole 88 may be provided in the upper frame 821. The sleeve insertion hole 89 may be provided in a location of the upper frame 811 that opposes the sleeve through-hole 88. The sleeve through-hole 88 and the sleeve insertion hole 89 may be formed as circles that have the same size.

The washer 90 may be formed as a ring-shaped plate into which the male screw portion 862 can be inserted.

The nut 91 may be configured to be capable of being tightened down onto the bolt 86.

The fall prevention unit 92 may include a fall prevention unit main body 921. The fall prevention unit main body 921 may be formed as a block that is approximately U-shaped when viewed from the −Y direction. The fall prevention unit main body 921 may be attached to the upper frame 821 so that the approximately U-shaped arc is positioned below using a bolt 929 that passes through the fall prevention unit main body 921 in the Y direction.

A first groove portion 922 that is recessed downward may be formed in a portion of the fall prevention unit main body 921 spanning from an end in the +Y direction to approximately the middle of the Y direction. A second groove portion 923 that is recessed in the same direction as the first groove portion 922 may be formed on the −Y direction side of the first groove portion 922. A third groove portion 924 that is recessed in the same direction as the second groove portion 923 may be formed on the −Y direction side of the second groove portion 923 and at the end of the fall prevention unit main body 921 in the −Y direction. Base areas of the first groove portion 922, the second groove portion 923, and the third groove portion 924 may be formed as semicircular arc surfaces.

The dimension of the first groove portion 922 in the X direction may be greater than the dimension of the positioning sleeve 87 in the X direction. A dimension Y11 of the first groove portion 922 in the Y direction may be greater than a length dimension Y1 of the positioning sleeve 87. According to such a configuration, the positioning sleeve 87 can be held in the base area of the first groove portion 922 when a worker moves the positioning sleeve 87 in the −Y direction and the positioning sleeve 87 has come out of the sleeve through-hole 88. Meanwhile, the dimension Y11 may be of a size in which the end surface on the −Y direction side of the bolt 86 that is tightened into the nut 91 is located further in the +Y direction than an end edge on the −Y direction of the first groove portion 922.

The dimensions of the second groove portion 923 in the X, Y, and Z directions may be smaller than the respective dimensions of the first groove portion 922 in the X, Y, and Z directions. According to such a configuration, a sleeve movement regulation portion 925 that is parallel to the XZ plane can be formed in an area spanning from the end edge on the −Y direction side of the first groove portion 922 to the end edge on the +Y direction side of the second groove portion 923.

The dimension of the second groove portion 923 in the X direction may be smaller than the dimension of the peripheral edge contact portion 872 in the X direction. According to such a configuration, the positioning sleeve 87 can be prevented from moving from the first groove portion 922 to the second groove portion 923, and a state in which the positioning sleeve 87 is contained within the first groove portion 922 can be maintained.

The dimension of the second groove portion 923 in the X direction may be greater than the dimension of the bolt head 861 in the X direction. The dimension of the second groove portion 923 in the Z direction may be of a size that the bolt head 861 does not make contact with the sleeve movement regulation portion 925 when a worker moves the bolt 86 in the −Y direction. According to such a configuration, it can be possible for a worker to move the bolt 86 until the bolt head 861 is located within the second groove portion 923.

The respective dimensions of the third groove portion 924 in the X, Y, and Z directions may be smaller than the respective dimensions of the second groove portion 923 in the X, Y, and Z directions. According to such a configuration, a bolt loss prevention portion 926 that is parallel to the XZ plane can be formed in an area spanning from the end edge on the −Y direction side of the second groove portion 923 to the end edge on the +Y direction side of the third groove portion 924.

The dimension of the third groove portion 924 in the X direction may be greater than the dimension of the tool 100 in the X direction and smaller than the dimension of the bolt head 861 in the X direction. The dimension of the third groove portion 924 in the Z direction may be of a size that the bolt head 861 makes contact with the bolt loss prevention portion 926 when a worker moves the bolt 86 in the −Y direction. According to such a configuration, movement of the bolt 86 in the −Y direction is regulated by contact between the bolt head 861 and the bolt loss prevention portion 926, and the bolt 86 can be prevented from falling.

A dimension Y12 from the bolt loss prevention portion 926 to an outside surface 852 of the upper frame 821 may be smaller than a length dimension Y2 of the bolt 86. According to such a configuration, in a case where the worker has moved the bolt 86 until the bolt head 861 makes contact with the bolt loss prevention portion 926, the leading end side of the male screw portion 862 can protrude to the outside of the upper frame 821 via the sleeve through-hole 88.

The holding unit 93 may include a holding unit main body 931. The holding unit main body 931 may be formed as a block whose shape is the same approximate U-shape as the fall prevention unit main body 921 when viewed from the +Y direction. The holding unit main body 931 may be attached to the upper frame 811 so that the approximately U-shaped arc is positioned below using a bolt 939 that passes through the holding unit main body 931 in the Y direction.

A washer containment groove portion 932 that is recessed downward may be formed in an end portion of the holding unit main body 931 on the −Y direction side. A bolt anchoring groove portion 933 that is recessed in the same direction as the washer containment groove portion 932 may be formed on the +Y direction side of the washer containment groove portion 932. A bolt projection groove portion 934 that is recessed in the same direction as the bolt anchoring groove portion 933 may be formed in an end of the holding unit main body 931 on the +Y direction side thereof, the end being toward the +Y direction side of the bolt anchoring groove portion 933. The base areas of the washer containment groove portion 932 and the bolt projection groove portion 934 may be formed as semicircular arc surfaces.

A dimension of the washer containment groove portion 932 in the X direction thereof may be essentially equal to a diameter dimension of the washer 90. A dimension of the washer containment groove portion 932 in the Y direction thereof may be essentially equal to a thickness dimension of the washer 90. According to this configuration, the washer containment groove portion 932 can contain the washer 90.

A dimension of the bolt anchoring groove portion 933 in the Y direction thereof may be essentially equal to a thickness dimension of the nut 91. As shown in FIG. 9, the base area of the bolt anchoring groove portion 933 may be formed having an approximately sectional V shape with which the nut 91 can engage. A dimension of the bolt anchoring groove portion 933 in the X direction thereof may be of a size in which the nut 91 can be inserted into the bolt anchoring groove portion 933 from above. The respective dimensions of the bolt projection groove portion 934 in the X, Y, and Z directions may be smaller than the respective dimensions of the bolt anchoring groove portion 933 in the X, Y, and Z directions. According to this configuration, the bolt anchoring groove portion 933 can contain the nut 91 while preventing the nut 91 from rotating.

3.2.3 Operation

Next, methods for manufacturing and for breaking down/reconnecting the laser apparatus will be described.

In order to manufacture and convey the laser apparatus 3, a worker may carry out operations based on step 1 to step 5, described hereinafter.

(Step 1) assembling the laser apparatus housing 8

(Step 2) mounting of first to fourth laser system modules 331 to 334 into the laser apparatus housing 8, and adjusting the laser apparatus 3

(Step 3) breaking down the laser apparatus housing 8

(Step 4) transport of the laser apparatus 3

(Step 5) reconnecting the laser apparatus housing 8

These steps will be described in detail below.

3.2.3.1 Assembly of Laser Apparatus Housing

The worker may prepare the first to fourth frames 81 to 84 that do not contain the first to fourth laser system modules 331 to 334. The tool holes 80, the sleeve through-holes 88 or the sleeve insertion holes 89, and the cutout portions 851 may be formed in the first to fourth frames 81 to 84.

The worker may, as shown in FIG. 4, snugly align the first to fourth frames 81 to 84 so that the respective sleeve through-holes 88 and the sleeve insertion holes 89 oppose each other. Thereafter, as shown in FIG. 7, the worker may insert the cylindrical portion 871 of the positioning sleeve 87 into the sleeve through-hole 88 and the sleeve insertion hole 89 until the peripheral edge contact portion 872 makes contact with the inner surface of the upper frame 821. The positioning of the first frame 81 and the second frame 82 in the X and Z directions can be performed as a result of this positioning sleeve 87 insertion. Next, the worker may insert the bolt 86 into the positioning sleeve 87 and cause the male screw portion 862 to project into the upper frame 811. Thereafter, the worker may pass the male screw portion 862 through the washer 90 and tighten the bolt 86 into the nut 91 by hand. This tightening may be temporary and need not be carried out at a specified torque.

The worker may carry out the aforementioned procedure for the areas in the first to fourth frames 81 to 84 in which the connecting portion 85 is provided.

The worker may bring the fall prevention unit 92 snug to the upper frame 821 from the −Y direction side and anchor the fall prevention unit 92 to the inner surface of the upper frame 821 using the bolt 929. By anchoring the fall prevention unit 92 to the upper frame 821, the fall prevention unit 92 can be positioned below and to the side of the bolt 86 and the positioning sleeve 87. Through this, the bolt 86 and the positioning sleeve 87 can be prevented from falling.

The worker may bring the holding unit 93 snug against the inner surface of the upper frame 811 from the +Y direction side and anchor the holding unit 93 to the upper frame 811 using the bolt 939. When anchoring the holding unit 93 in this manner, the worker may prevent the nut 91 from rotating by fitting the nut 91 into the bolt anchoring groove portion 933. The worker may then tighten the bolt 86 into the nut 91 completely at a specified torque. The first frame 81 and the second frame 82 can be positioned in the Y direction as a result of this tightening.

The worker may carry out the aforementioned procedure for the areas in the first to fourth frames 81 to 84 in which the connecting portion 85 is provided.

The assembly of the laser apparatus housing 8 can be completed through the above-described procedure.

3.2.3.2 Mounting of First to Fourth Laser System Modules in Laser Apparatus Housing and Laser Apparatus Adjustment The worker may attach, to the laser apparatus housing 8, dampers that support the respective frames from the floor surface, as well as wires and pipes leading to the laser system modules (not shown). The worker may then mount the first to fourth laser system modules 331 to 334 in the respective first to fourth frames 81 to 84 of the laser apparatus housing 8, and may then install an outer panel (not shown).

Next, the worker may adjust the laser apparatus 3. This adjustment may be carried out by adjusting positions of the various units that configure the first laser system module 331, the second laser system module 332, the third laser system module 333, and the fourth laser system module 334, adjusting the installation angles thereof, and so on, so that the output locations, intensities, beam diameters, and so on of the main pulse laser beam and the pre-pulse laser beam are in appropriate states. In other words, the worker may perform positioning among the first to fourth laser system modules 331 to 334. Then, when the adjustment has been completed, the worker may anchor the first to fourth laser system modules 331 to 334 to the first to fourth frames 81 to 84, respectively.

The manufacture of the laser apparatus 3 can be completed through the above-describe procedure.

3.2.3.3 Breakdown of Laser Apparatus Housing

The worker may insert a jack (not shown) between the laser apparatus housing 8 of the laser apparatus 3 whose manufacture has been completed and the floor, and may then partially remove the outer panel, the wiring, the pipes, and the dampers. Thereafter, the worker may remove the master oscillator 300 from the first laser system module 331 as necessary. The worker may then break the laser apparatus housing 8 down into the first frame 81, the second frame 82, the third frame 83, and the fourth frame 84.

At this time, the worker may loosen the bolt 86 from the nut 91 by inserting the tool 100 from the tool hole 80 in the second frame 82. By loosening the bolt 86 from the nut 91, the positioning between the first frame 81 and the second frame 82 illustrated in FIG. 7 can be undone.

The worker may then perform the aforementioned operations for all of the connecting portions 85 and undo the positioning between the frames that oppose each other.

Next, the worker may remove the bolt 86 and the positioning sleeve 87 from the sleeve insertion hole 89 by moving the first frame 81 in the +Y direction.

The worker may then move the bolt 86 and the positioning sleeve 87 in the −Y direction. At this time, the entire positioning sleeve 87 can be removed from the sleeve through-hole 88 because the length dimension Y1 of the positioning sleeve 87 is smaller than the dimension Y11 of the first groove portion 922.

Meanwhile, the movement of the bolt 86 is regulated by the bolt head 861 of the bolt 86 making contact with the bolt loss prevention portion 926. When the bolt head 861 makes contact with the bolt loss prevention portion 926, the leading end side of the male screw portion 862 can project to the outer side of the upper frame 821 via the sleeve through-hole 88. The bolt 86 and the positioning sleeve 87 can be prevented from falling by the movement of the bolt 86 being regulated in this manner. In addition, the male screw portion 862 can support the positioning sleeve 87 that has exited off the sleeve through-hole 88.

After this, the worker may perform the above-described operations for all of the connecting portions 85.

The breakdown of the laser apparatus housing 8 can be completed by separating the first frame 81, the second frame 82, the third frame 83, and the fourth frame 84 from each other.

3.2.3.4 Transport of Laser Apparatus

The worker may transport the respective constituent components of the laser apparatus 3 that has been broken down. At this time, the worker may transport the first to fourth laser system modules 331 to 334 with those laser modules still anchored to the first to fourth frames 81 to 84, respectively. The first to fourth frames 81 to 84 may be transported in a state in which the bolt 86 and the positioning sleeve 87 are prevented from falling by the fall prevention unit 92 and the washer 90 and the nut 91 are prevented from falling by the holding unit 93.

3.2.3.5 Reconnecting of Laser Apparatus Housing

A worker may reconnect the laser apparatus housing 8 at a transport destination of the laser apparatus 3. At this time, the same method as the method for assembling the laser apparatus housing described above may be used.

In other words, the worker may insert a jack (not shown) between the first to fourth frames 81 to 84 and the floor, and may attach dampers that support the first to fourth frames 81 to 84 on the surface of the floor to those respective frames. Next, the worker may snugly align the first to fourth frames 81 to 84 so that the respective sleeve through-holes 88 and sleeve insertion holes 89 oppose each other and so that the male screw portions 862 projecting via the sleeve through-holes 88 are inserted into the corresponding sleeve insertion holes 89. After this, the worker may insert the tool 100 via the tool hole 80 of the second frame 82 (moving the tool in the +Y direction), and may engage the tool 100 with the tool groove 863 in the bolt 86. At this time, because the male screw portion 862 is positioned within the sleeve through-hole 88 and a depth direction of the tool groove 863 essentially matches the direction in which the tool 100 is inserted, the tool 100 can easily engage with the tool groove 863.

Next, the worker may further insert the tool 100 that is engaged with the tool groove 863. As a result of this insertion, the positioning sleeve 87 that is supported by the male screw portion 862 can be pushed in the +Y direction by the bolt head 861 of the bolt 86, and can be inserted into the sleeve through-hole 88 and the sleeve insertion hole 89. The positioning sleeve 87 is thus inserted into the sleeve through-hole 88 and the sleeve insertion hole 89, and thus the first frame 81 and the second frame 82 can be positioned, primarily in the X direction and the Z direction.

Meanwhile, when the tool 100 has been inserted and the leading end of the male screw portion 862 has made contact with the nut 91, the worker may tighten the bolt 86 into the nut 91 by rotating the tool 100. At this time, the nut 91 is prevented from rotating by the holding unit 93, and thus the worker can tighten the bolt 86 simply by rotating the tool 100. By tightening the bolt 86, the first frame 81 and the second frame 82 can be positioned, primarily in the Y direction.

Then, the worker may position the first frame 81 and the second frame 82 in the X, Y, and Z directions using the tool 100 inserted from the −Y direction side in two (upper and lower) locations in the second frame 82, and then may perform the following operations in the order listed, through similar operations as those described above:

positioning the first frame 81 and the second frame 82 in the X, Y, and Z directions by manipulating the tool 100 from the +Y direction side of the first frame 81;

positioning the third frame 83 and the fourth frame 84 in the X, Y, and Z directions by manipulating the tool 100 from the −Y direction side of the fourth frame 84;

positioning the third frame 83 and the fourth frame 84 in the X, Y, and Z directions by manipulating the tool 100 from the +Y direction side of the third frame 83;

positioning the first frame 81 and the third frame 83 in the X, Y, and Z directions by manipulating the tool 100 from the −X direction side of the third frame 83; and positioning the second frame 82 and the fourth frame 84 in the X, Y, and Z directions by manipulating the tool 100 from the −X direction side of the fourth frame 84.

Through the aforementioned operations, the first to fourth frames 81 to 84 can be positioned in the X, Y, and Z directions in the same manner as prior to the breakdown. By positioning the first to fourth frames 81 to 84 in the same manner as prior to the breakdown, the first to fourth laser system modules 331 to 334 can be positioned in the same manner as when the adjustment thereof was completed. Accordingly, it can be made unnecessary to perform fine adjustments on the laser apparatus 3 at the transport destination of the laser apparatus 3.

After this, in the case where the master oscillator 300 had been removed, the master oscillator 300 may be reattached. The worker can then complete the reconnecting of the laser apparatus housing 8 by attaching the wires, pipes, and outer panel (not shown) to the laser apparatus housing 8.

As described above, the first frame 81 and the second frame 82 may be positioned by inserting the positioning sleeve 87 into the sleeve through-hole 88 and the sleeve insertion hole 89 and tightening the bolt 86 into the nut 91.

By using the positioning sleeve 87 to position the first frame 81 and the second frame 82 and to tighten the bolt 86 in this manner, a problem in which the male screw portion 862 of the bolt 86 collapses when positioning the first frame 81 and the second frame 82 in the case where the bolt 86 is used for both the positioning and the tightening can be suppressed.

In addition, the fall prevention unit 92 can prevent the bolts 86 and the positioning sleeves 87 from falling while transporting the first to fourth frames 81 to 84 and can hold the bolts 86 and the positioning sleeves 87 in positions that are close to the areas of connection between the first to fourth frames 81 to 84. Accordingly, even in a case where it is necessary for the worker to perform connection operations from a position that is outside of the first to fourth frames 81 to 84 and distanced from the areas of connection, it can be made unnecessary for the bolts 86 and the positioning sleeve 87 to be conveyed to those areas of connection. Accordingly, the worker can easily position the first frame 81 and the second frame 82 using the positioning sleeve 87 and tighten the bolt 86 into the nut 91 from the outside of the first to fourth frames 81 to 84 using, for example, the tool 100 that is long and thus reaches the areas of connection.

Even in a case where the overall size of the laser apparatus 3 is large and cannot pass through a path to an installation site as-is, breaking down the laser apparatus 3 into the first to fourth frames 81 to 84 and transporting the frames individually can make it possible to convey the laser apparatus 3 through the path to the installation site. Furthermore, transporting the frames individually can make it possible to transport the laser apparatus 3 by air. In addition, because the first to fourth laser system modules 331 to 334 are positioned prior to transport, all that is necessary is to reconnect the first to fourth frames 81 to 84 at the installation site, and it can thus be made unnecessary to reposition the first to fourth laser system modules 331 to 334 at the installation site. Accordingly, the number of operations and operation time at the installation site can be reduced.

Because the peripheral edge contact portion 872 of the positioning sleeve 87 makes contact with the peripheral edge of the sleeve through-hole 88, the connecting portion 85 can prevent the positioning sleeve 87 from, for example, being pushed too far toward the first frame 81. Accordingly, it can be made unnecessary to perform fine adjustments on the amount to which the positioning sleeve 87 is pushed in.

The fall prevention unit 92 can prevent the bolt 86 from falling out of the sleeve through-hole 88 using the bolt loss prevention portion 926. Accordingly, when reconnecting the first to fourth frames 81 to 84 at the installation site, it can be made unnecessary to perform an operation for passing the bolt 86 through the sleeve through-hole 88.

Although a configuration in which the holding unit 93 contains the nut 91 is disclosed here, it should be noted that the nut 91 may, for example, be welded to the first frame 81 rather than providing the holding unit 93.

Furthermore, although the sleeve insertion hole 89 that passes through the first frame 81 is disclosed as a sleeve insertion portion, a cylindrical member that extends in the +Y direction within the first frame 81 may be provided as the sleeve insertion portion. In this case, a female screw portion may be provided in part of the inner peripheral surface of the cylindrical sleeve insertion portion, rather than providing the nut 91.

3.3 Second Embodiment
3.3.1 Overview

According to a second embodiment of the present disclosure, a fall prevention unit of the laser apparatus may include a sleeve loss prevention portion.

According to the laser apparatus of the present embodiment, the positioning sleeve can be prevented from falling out of the sleeve through-hole by the sleeve loss prevention portion. Accordingly, when reconnecting a pair of frames at an installation site, it can be made unnecessary to perform an operation for passing the positioning sleeve through the sleeve through-hole.

3.3.2 Configuration

Figure 10:
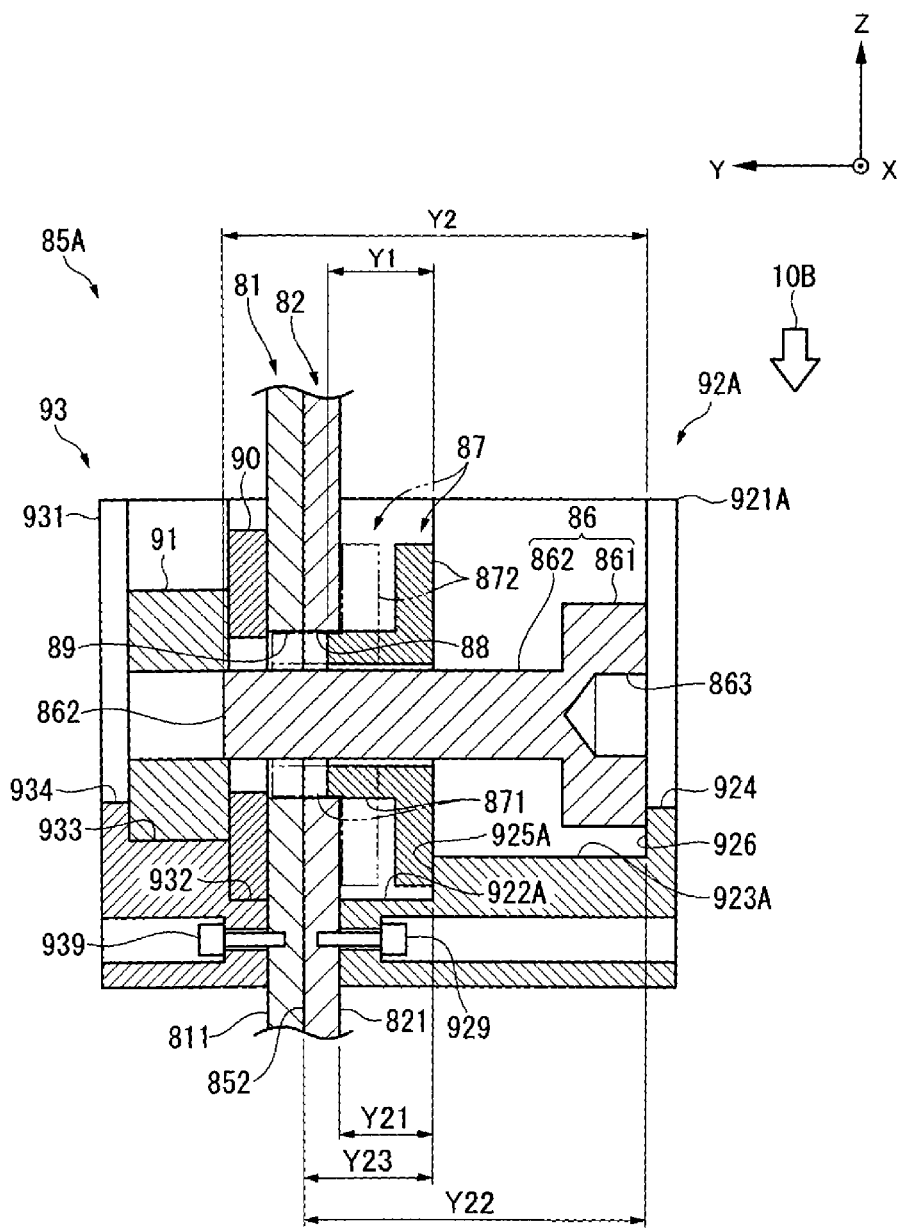
FIG. 10 is a sectional view illustrating a connecting portion according to a second embodiment.

FIG. 10 is a sectional view illustrating a connecting portion according to the second embodiment.

Note that in the following embodiments, of the configuration of the laser apparatus, only the configuration of the connecting portions differs from the first embodiment, and thus the configuration of the connecting portions will be described in detail.

The difference between a connecting portion 85A according to the second embodiment and the connecting portion 85 according to the first embodiment may, as shown in FIG. 10, be only a fall prevention unit 92A.

The fall prevention unit 92A of the connecting portion 85A may include a fall prevention unit main body 921A that has a similar shape as the fall prevention unit main body 921.

A first groove portion 922A, a second groove portion 923A, the third groove portion 924, a sleeve loss prevention portion 925A, and the bolt loss prevention portion 926 may be formed in the fall prevention unit main body 921A. The first groove portion 922A may be formed on the +Y direction side of the second groove portion 923A. The third groove portion 924 may be formed on the −Y direction side of the second groove portion 923A. Base areas of the first groove portion 922A and the second groove portion 923A may be formed as semicircular arc surfaces.

Dimensions of the first groove portion 922A in the X direction and the Z direction may be approximately equal to the dimensions of the first groove portion 922 according to the first embodiment. A dimension Y21 of the first groove portion 922A in the Y direction may be less than the length dimension Y1 of the positioning sleeve 87. In addition, a dimension Y23 from the sleeve loss prevention portion 925A to the outside surface 852 of the upper frame 821 may be greater than the length dimension Y1 of the positioning sleeve 87.

Dimensions of the second groove portion 923A in the X direction and the Z direction may be approximately equal to the dimensions of the second groove portion 923 according to the first embodiment. A dimension Y22 from the bolt loss prevention portion 926 to the outside surface 852 may be smaller than the length dimension Y2 of the bolt 86.

3.3.3 Operation

Next, operations of the laser apparatus will be described.

Of step 1 to step 5 of the laser apparatus operations described in the first embodiment, steps 1 and 2 are essentially the same as those in the first embodiment, and therefore step 3 to step 5 will be described hereinafter. With respect to step 3 to step 5, items that differ from those in the first embodiment will be described in detail, whereas descriptions of items that are the same as those in the first embodiment will be omitted.

3.3.3.1 Breakdown of Laser Apparatus Housing

The laser apparatus housing 8 may be broken down into the first frame 81, the second frame 82, the third frame 83, and the fourth frame 84. At this time, the worker may loosen the bolt 86 from the nut 91 and undo the positioning between the first frame 81 and the second frame 82 in the Y direction.

Next, the worker may undo the positioning between the first frame 81 and the second frame 82 in the X direction and the Z direction by moving the first frame 81 in the +Y direction and removing the bolt 86 and the positioning sleeve 87 from the sleeve insertion hole 89.

The worker may then move the bolt 86 and the positioning sleeve 87 in the −Y direction. At this time, because the length dimension Y1 of the positioning sleeve 87 is greater than the dimension Y21 of the first groove portion 922A, the peripheral edge contact portion 872 can make contact with the sleeve loss prevention portion 925A, and the movement of the positioning sleeve 87 can be regulated as a result, before the entire cylindrical portion 871 comes out of the sleeve through-hole 88. The positioning sleeve 87 can be prevented from coming out of the sleeve through-hole 88 as a result of this regulation of the movement of the positioning sleeve 87. In addition, because the length dimension Y1 of the positioning sleeve 87 is less than the dimension Y23, the cylindrical portion 871 can be suppressed from projecting out from the outside surface 852.

Meanwhile, the movement of the bolt 86 is regulated by the bolt head 861 of the bolt 86 making contact with the bolt loss prevention portion 926. At this time, because the dimension Y22 is less than the length dimension Y2 of the bolt 86, the male screw portion 862 can project to the outside of the upper frame 821 via the sleeve through-hole 88.

The breakdown of the laser apparatus housing 8 can be completed by the worker performing the above-described operations on all of the connecting portions 85A and separating the first frame 81, the second frame 82, the third frame 83, and the fourth frame 84 from each other.

3.3.3.2 Transport of Laser Apparatus

The worker may transport the respective constituent components of the laser apparatus 3 that has been broken down. The first to fourth frames 81 to 84 can be transported in a state in which the fall prevention unit 92A prevents the positioning sleeve 87 from coming out of the sleeve through-hole 88 and prevents the bolt 86 and the positioning sleeve 87 from falling. In addition, the first to fourth frames 81 to 84 can be transported in a state in which the fall prevention unit 92A suppresses the cylindrical portion 871 from projecting out from the outside surface 852.

3.3.3.3 Reconnecting of Laser Apparatus Housing

A worker may reconnect the laser apparatus housing 8 at a transport destination of the laser apparatus 3.

The worker may snugly align the first to fourth frames 81 to 84 so that the respective sleeve through-holes 88 and sleeve insertion holes 89 oppose each other and so that the male screw portions 862 projecting via the sleeve through-holes 88 are inserted into the corresponding sleeve insertion holes 89. After this, the worker may engage the tool 100 with the tool groove 863 of the bolt 86 and insert the tool 100 in the +Y direction. As a result of this insertion, the positioning sleeve 87 can be pushed by the bolt head 861 of the bolt 86, and can be inserted into the sleeve through-hole 88 and the sleeve insertion hole 89. The positioning sleeve 87 is thus inserted into the sleeve through-hole 88 and the sleeve insertion hole 89, and thus the first frame 81 and the second frame 82 can be positioned, primarily in the X direction and the Z direction. At this time, the positioning sleeve 87 is prevented from coming out from the sleeve through-hole 88 by the fall prevention unit 92A, and thus it can be easier to insert the positioning sleeve 87 into the sleeve through-hole 88 and the sleeve insertion hole 89 than in the case where the positioning sleeve 87 has come out from the sleeve through-hole 88.

In addition, the worker may position the first frame 81 and the second frame 82 primarily in the Y direction by tightening the bolt 86 into the nut 91. Thereafter, the worker can complete the reconnecting of the laser apparatus housing 8 by performing the above-described operations for all of the connecting portions 85A and attaching pipes and the like (not shown) to the laser apparatus housing 8.

As described above, the fall prevention unit 92A can prevent the positioning sleeve 87 from coming out of the sleeve through-hole 88 using the sleeve loss prevention portion 925A. Accordingly, when reconnecting the first frame 81 to the fourth frame 84 at an installation site, it can be made unnecessary to perform an operation for passing the positioning sleeve 87 through the sleeve through-hole 88.

3.4 Third Embodiment 3.4.1 Overview

According to a third embodiment of the present disclosure, a fall prevention unit may include a sleeve loss prevention portion and a bolt loss prevention portion. The sleeve loss prevention portion may prevent the positioning sleeve from coming out of the sleeve through-hole, in a state where the positioning sleeve does not project from a frame. The bolt loss prevention portion may prevent a bolt from coming out of the sleeve through-hole, in a state where the bolt does not project from the frame.

According to the laser apparatus of the present embodiment, the positioning sleeve and the bolt can be prevented from falling out of the sleeve through-hole by the sleeve loss prevention portion and the bolt loss prevention portion. Accordingly, when reconnecting a pair of frames at an installation site such as a clean room, it can be made unnecessary to perform an operation for passing the positioning sleeve and the bolt through the sleeve through-hole.

Furthermore, the worker can transport the frame while maintaining the state in which the positioning sleeve and the bolt do not project from the frame. Accordingly, even in a situation where sufficient space cannot be secured between the frame and a wall next to the frame, a problem in which the positioning sleeve, the bolt, or the like that projects from the frame damages the wall can be suppressed.

3.4.2 Configuration

Figure 11:
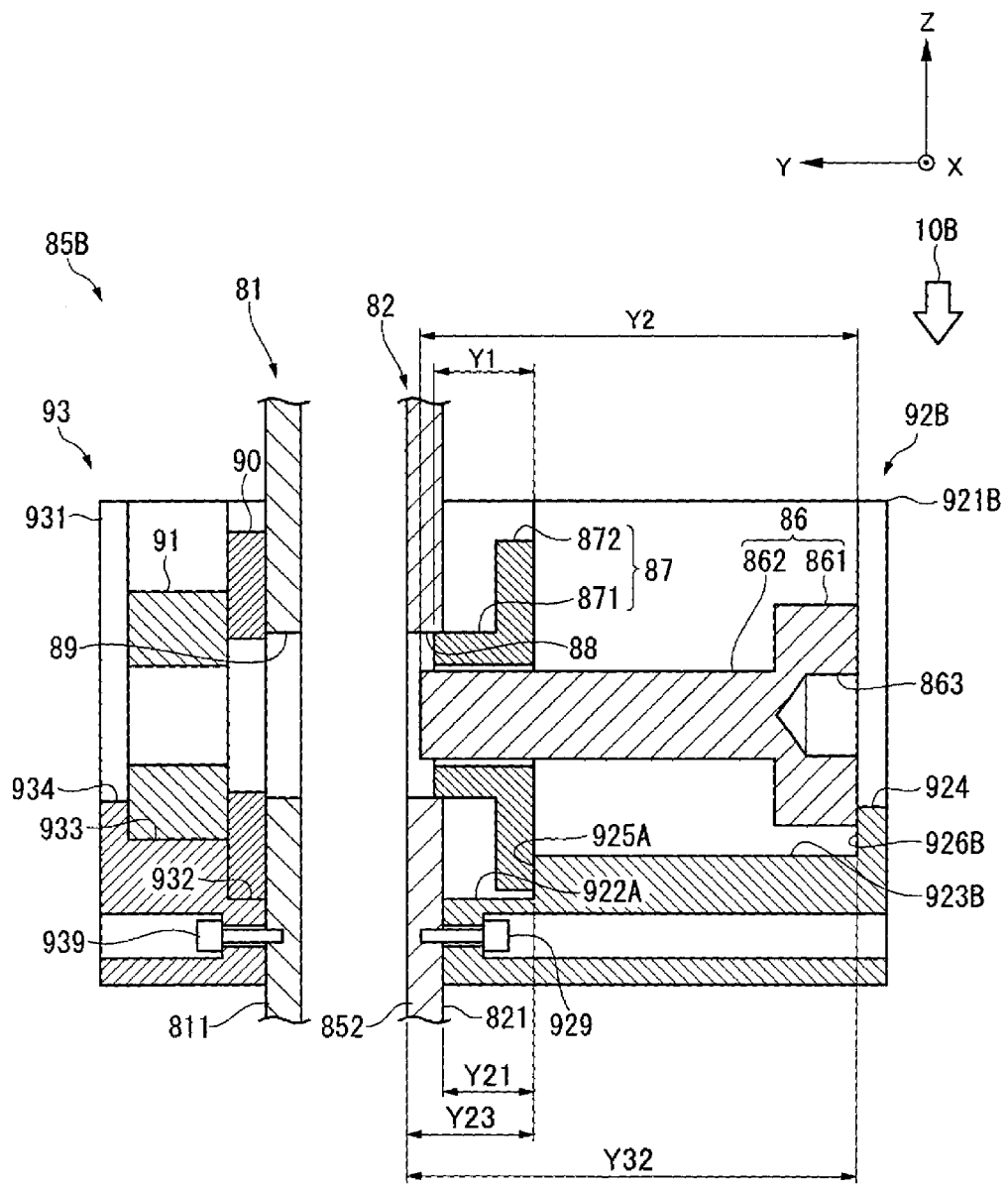
FIG. 11 is a sectional view illustrating a connecting portion according to a third embodiment.

FIG. 11 is a sectional view illustrating a connecting portion according to the third embodiment.

The difference between a connecting portion 85B according to the third embodiment and the connecting portion 85A according to the second embodiment may, as shown in FIG. 11, be only a fall prevention unit 92B.

The fall prevention unit 92B of the connecting portion 85B may include a fall prevention unit main body 921B that has a similar shape as the fall prevention unit main body 921A.

The first groove portion 922A, a second groove portion 923B, the third groove portion 924, the sleeve loss prevention portion 925A, and a bolt loss prevention portion 926B may be formed in the fall prevention unit main body 921B. The second groove portion 923B may be formed between the first groove portion 922A and the third groove portion 924. A base area of the second groove portion 923B may be formed as a semicircular arc surface.

Dimensions of the second groove portion 923B in the X direction and the Z direction may be approximately equal to the dimensions of the second groove portion 923 according to the first embodiment. A dimension Y32 from the bolt loss prevention portion 926B to the outside surface 852 may be greater than the length dimension Y2 of the bolt 86.

3.4.3 Operation

Next, operations of the laser apparatus will be described.

Of step 1 to step 5 of the laser apparatus operations described in the first embodiment, steps 1 and 2 are essentially the same as those in the first embodiment, and therefore step 3 to step 5 will be described in detail hereinafter. When describing step 3 to step 5, items that differ from those in the first and second embodiments will be described in detail, whereas descriptions of items that are the same as those in the first and second embodiments will be omitted.

3.4.3.1 Breakdown of Laser Apparatus Housing

The worker may undo the positioning between the first frame 81 and the second frame 82 in the X, Y, and Z directions by loosening the bolt 86 from the nut 91 and removing the bolt 86 and the positioning sleeve 87 from the sleeve insertion hole 89.

The worker may then move the bolt 86 and the positioning sleeve 87 in the −Y direction. At this time, the fall prevention unit 92B can prevent the positioning sleeve 87 from coming out of the sleeve through-hole 88 and can suppress the cylindrical portion 871 from projecting out of the outside surface 852.

In addition, because the length dimension Y2 of the bolt 86 is less than the dimension Y32, the fall prevention unit 92B can suppress the male screw portion 862 from projecting out from the outside surface 852.

The breakdown of the laser apparatus housing 8 can be completed by the worker performing the above-described operations on all of the connecting portions 85B and separating the first frame 81, the second frame 82, the third frame 83, and the fourth frame 84 from each other.

3.4.3.2 Transport of Laser Apparatus

The worker may transport the respective constituent components of the laser apparatus 3 that has been broken down. The first to fourth frames 81 to 84 can be transported in a state in which the fall prevention unit 92B prevents the positioning sleeve 87 from coming out of the sleeve through-hole 88 and prevents the bolt 86 and the positioning sleeve 87 from falling. In addition, the first to fourth frames 81 to 84 can be transported in a state in which the fall prevention unit 92B suppresses the cylindrical portion 871 and the male screw portion 862 from projecting out from the outside surface 852.

3.4.3.3 Reconnecting of Laser Apparatus Housing

A worker may reconnect the laser apparatus housing 8 at a transport destination of the laser apparatus 3.

The worker may snugly align the first to fourth frames 81 to 84 so that the respective sleeve through-holes 88 and sleeve insertion holes 89 oppose each other. After this, the worker may insert the positioning sleeve 87 into the sleeve through-hole 88 and the sleeve insertion hole 89 by moving the bolt 86 in the +Y direction using the tool 100. Furthermore, the worker may tighten the bolt 86 into the nut 91. The first frame 81 and the second frame 82 can be positioned in the X, Y, and Z directions as a result of the aforementioned operations. Thereafter, the worker can complete the reconnecting of the laser apparatus housing 8 by performing the above-described operations for all of the connecting portions 85B and attaching pipes and the like (not shown) to the laser apparatus housing 8.

As described above, the fall prevention unit 92B can prevent the bolt 86 and the positioning sleeve 87 from coming out of the sleeve through-hole 88. Accordingly, when reconnecting the first to fourth frames 81 to 84 at the installation site, it can be made unnecessary to perform an operation for inserting the bolt 86 and the positioning sleeve 87 into the sleeve through-hole 88. Furthermore, the worker can transport the first to fourth frames 81 to 84 while maintaining the state in which the bolt 86 and the positioning sleeve 87 do not project from the first to fourth frames 81 to 84. Accordingly, even in a situation where sufficient space cannot be secured between the first to fourth frames 81 to 84 and a wall next to the frames, a problem in which the bolt 86, the positioning sleeve 87, or the like that project from the first to fourth frames 81 to 84 damage the wall can be suppressed.

3.5 Fourth Embodiment 3.5.1 Overview

According to a fourth embodiment of the present disclosure, a sloped surface portion may be provided in the cylindrical portion of the positioning sleeve. The sloped surface portion may be sloped so that a leading end side of the outer peripheral surface of the cylindrical portion, in the direction in which a hole passes therethrough, narrows from the trailing end side toward the leading end side in the direction in which the hole passes therethrough.

According to the laser apparatus of the present embodiment, the cylindrical portion can be made easier to pass through the sleeve through-hole by providing the sloped surface portion in the cylindrical portion. In addition, even if the sleeve through-hole and the sleeve insertion portion are slightly skewed, it is easy to insert the cylindrical portion into the sleeve insertion portion, which can make it easy to position a pair of frames.

3.5.2 Configuration

Figure 12:
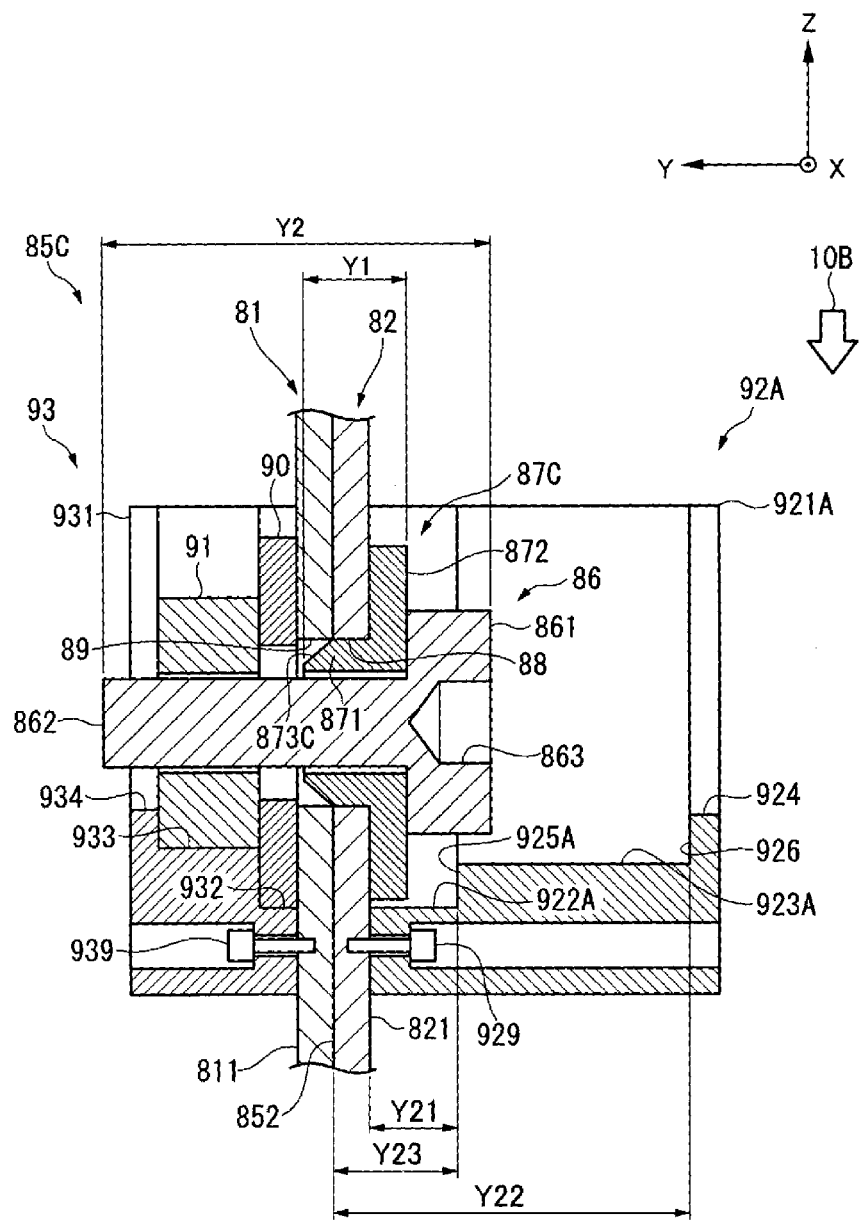
FIG. 12 is a sectional view illustrating a connecting portion according to a fourth embodiment.

FIG. 12 is a sectional view illustrating a connecting portion according to the fourth embodiment.

The difference between a connecting portion 85C according to the fourth embodiment and the connecting portion 85A according to the second embodiment may, as shown in FIG. 12, be only a positioning sleeve 87C.

The positioning sleeve 87C may include the cylindrical portion 871 and the peripheral edge contact portion 872. A sloped surface portion 873C having an approximately conical surface shape that is sloped to narrow moving away from the peripheral edge contact portion 872 may be provided in the leading end side of the cylindrical portion 871. According to this configuration, the outer diameter dimension of the sloped surface portion 873C can be less than the inner diameter dimension of the sleeve through-hole 88 and the inner diameter dimension of the sleeve insertion hole 89.

In addition, the length dimension Y1 of the positioning sleeve 87C may be greater than the dimension Y21 and less than the dimension Y23. According to such a configuration, the leading end of the cylindrical portion 871 can be suppressed from projecting out from the outside surface 852 when the positioning sleeve 87C has moved to a point of contact with the sleeve loss prevention portion 925A.

3.5.3 Operation

Next, operations of the laser apparatus will be described.

Of step 1 to step 5 of the laser apparatus operations described in the first embodiment, step 2 is essentially the same as that in the first embodiment, whereas steps 3 and 4 are essentially the same as those in the second embodiment; therefore steps 1 and 5 will be described in detail hereinafter. When describing steps 1 and 5, items that differ from those in the first embodiment will be described in detail, whereas descriptions of items that are the same as those in the first embodiment will be omitted.

3.5.3.1 Assembly of Laser Apparatus Housing

The worker may prepare the first to fourth frames 81 to 84 that do not contain the first to fourth laser system modules 331 to 334. The worker may snugly align the first frame 81 and the second frame 82 so that the sleeve through-holes 88 and the sleeve insertion holes 89 oppose each other. Thereafter, as shown in FIG. 12, the worker may insert the cylindrical portion 871 of the positioning sleeve 87C into the sleeve through-hole 88 and the sleeve insertion hole 89 until the peripheral edge contact portion 872 makes contact with the upper frame 821. At this time, because the outer diameter dimension of the sloped surface portion 873C is less than the inner diameter dimension of the sleeve through-hole 88, it can be possible to insert the cylindrical portion 871 into the sleeve through-hole 88 by sliding the sloped surface portion 873C along the inner edge of the sleeve through-hole 88, even if the center of the positioning sleeve 87C is slightly skewed from the center of the sleeve through-hole 88 in the X direction or the Z direction. Likewise, it can be possible to insert the cylindrical portion 871 into the sleeve insertion hole 89 by sliding the sloped surface portion 873C along the inner edge of the sleeve insertion hole 89, even if the center of the positioning sleeve 87C is slightly skewed from the center of the sleeve insertion hole 89.

The positioning of the first frame 81 and the second frame 82 primarily in the X and Z directions can be performed as a result of this positioning sleeve 87C insertion. Next, the worker may position the first frame 81 and the second frame 82 primarily in the Y direction by attaching to the fall prevention unit 92A and the holding unit 93 and tightening the bolt 86 into the nut 91.

Thereafter, the assembly of the laser apparatus housing 8 can be completed by the worker performing the aforementioned operations for all of the connecting portions 85C.

3.5.3.2 Reconnecting of Laser Apparatus Housing

A worker may reconnect the laser apparatus housing 8 at a transport destination of the laser apparatus 3.

The worker may snugly align the first to fourth frames 81 to 84 so that the respective sleeve through-holes 88 and sleeve insertion holes 89 oppose each other. After this, the worker may insert the positioning sleeve 87C into the sleeve through-hole 88 and the sleeve insertion hole 89 by moving the bolt 86 in the +Y direction using the tool 100. At this time, it can be possible to insert the cylindrical portion 871 into the sleeve insertion hole 89 by sliding the sloped surface portion 873C along the inner edge of the sleeve insertion hole 89, even if the center of the positioning sleeve 87C that passes through the sleeve through-hole 88 is slightly skewed from the center of the sleeve insertion hole 89. Furthermore, the worker may tighten the bolt 86 into the nut 91. The first frame 81 and the second frame 82 can be positioned in the X, Y, and Z directions as a result of the aforementioned operations. Thereafter, the worker can complete the reconnecting of the laser apparatus housing 8 by performing the above-described operations for all of the connecting portions 85C and attaching pipes and the like (not shown) to the laser apparatus housing 8.

As described above, the sloped surface portion 873C may be provided on the leading end of the cylindrical portion 871 of the positioning sleeve 87C. Through this, the leading end of the cylindrical portion 871 becomes smaller than the sleeve through-hole 88, and thus it can be made easier to pass the cylindrical portion 871 through the sleeve through-hole 88. In addition, even if the sleeve through-hole 88 and the sleeve insertion hole 89 are slightly skewed, it is easy to insert the cylindrical portion 871 into the sleeve insertion hole 89, which can make it easy to position the first to fourth frames 81 to 84.

3.6 Fifth Embodiment 3.6.1 Overview

According to a fifth embodiment of the present disclosure, the laser apparatus may include a first reinforcing plate anchored to one frame and a second reinforcing plate anchored to another frame. The first and second reinforcing plates may include first and second plate holes, respectively, through which the positioning sleeves can be passed.

Here, depending on the thickness of the frame, in a case where a load is applied to the frame after the bolt and the female screw portion have been tightened together, it is possible that the strength of the frame will be insufficient to handle the load. In such a case, the sleeve through-hole, the sleeve insertion portion, or the peripheral edges thereof can deform, resulting in a drop in the positioning accuracy between the pair of frames.

According to the laser apparatus of the present embodiment, reinforcing plates through which the positioning sleeves can be passed may be anchored to each of the frames in the pair of frames. Through this, even when a load is applied to the frame after the bolt and the female screw portion have been tightened together, it can be possible to disperse the load through the reinforcing plates. As a result, the sleeve through-hole, the sleeve insertion portion, or the peripheral edges thereof can be suppressed from deforming, and the positioning accuracy between the pair of frames can be maintained.

The sleeve insertion portion of the laser apparatus may be formed in the shape of a hole through which the positioning sleeve is passed. The female screw portion may be configured as a nut into which a bolt is screwed. The first and second reinforcing plates may include approximately cylindrical first and second cylindrical projecting portions that can pass through the sleeve through-holes and that project from the frames. First and second contact surfaces at which the leading ends of the first and second cylindrical projecting portions make contact with each other may be provided in the leading ends of the first and second cylindrical projecting portions, respectively.

Generally speaking, it can be difficult to manage the surface roughness, shape tolerances, and so on of the outer surface of a frame having comparatively large dimensions. Accordingly, in the case where a pair of frames are positioned relative to each other by being fitted snugly together, it can be difficult to reproduce the relative positions.

According to the laser apparatus of the present embodiment, providing the first and second contact surfaces in the first and second reinforcing plates that have comparatively small dimensions can make it easier to manage the surface roughness, the shape tolerances, and so on of the first and second contact surfaces. Accordingly, it can be easier to reproduce the relative positions between the frames in the pair of frames.

3.6.2 Configuration

Figure 13:
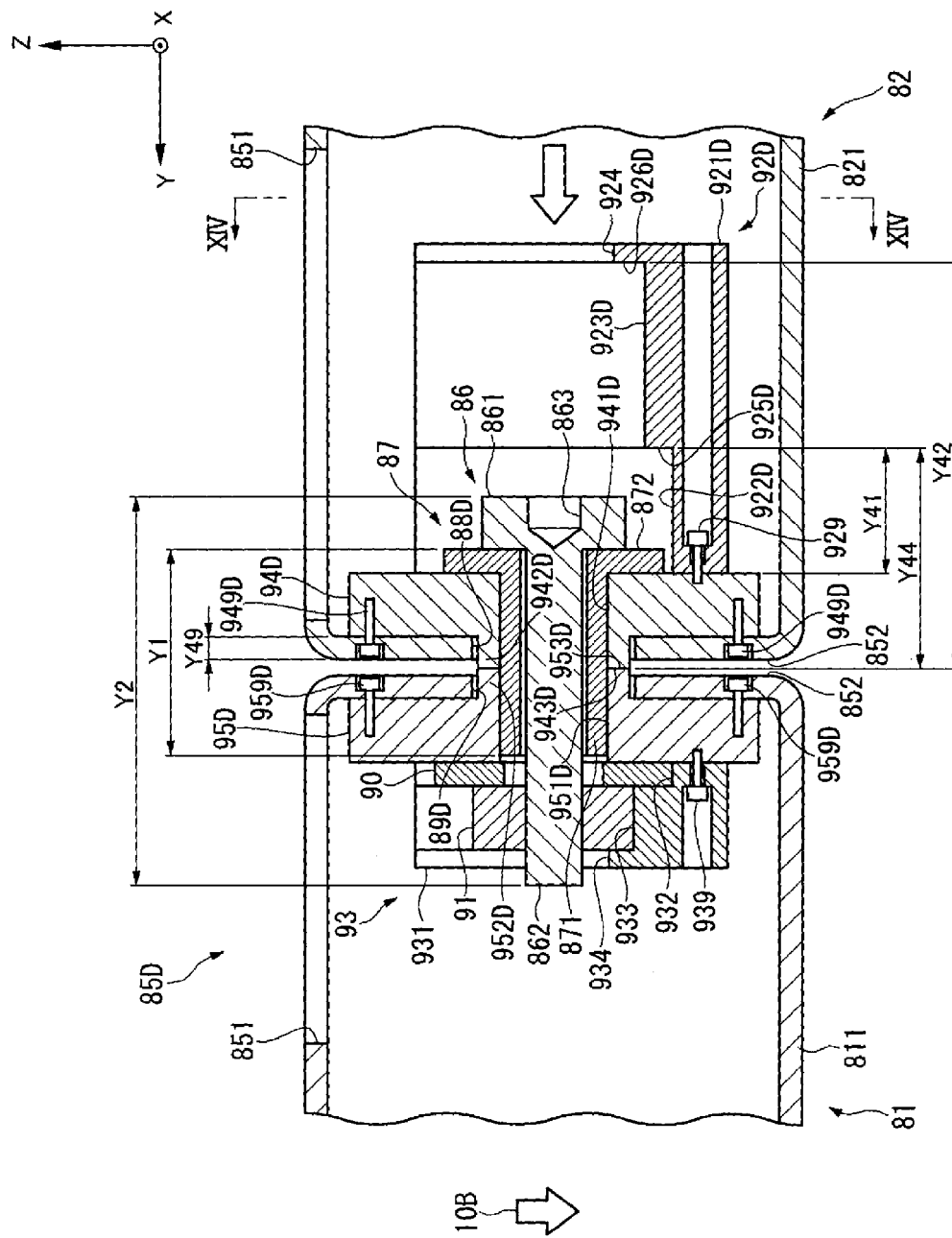
FIG. 13 is a sectional view illustrating a connecting portion according to a fifth embodiment.
Figure 14:
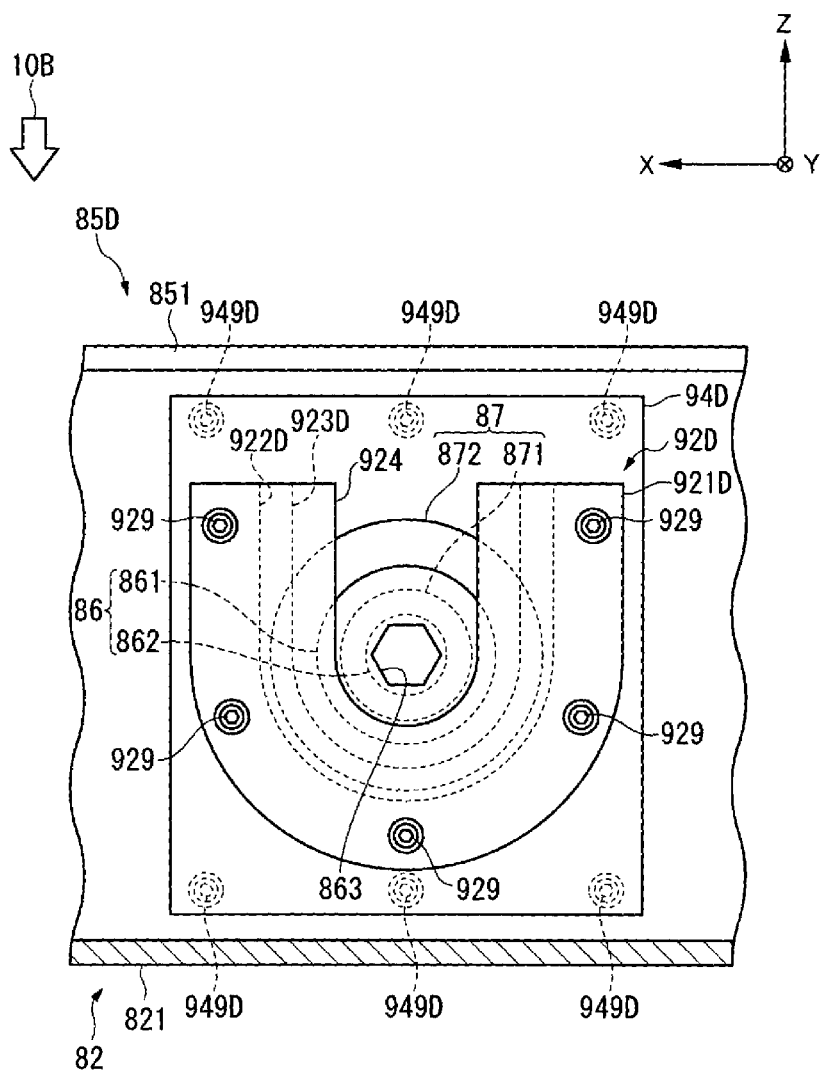
FIG. 14 is a cross-section viewed along XIV-XIV line shown in FIG. 13.

FIG. 13 is a sectional view illustrating a connecting portion according to the fifth embodiment. FIG. 14 is a cross-section viewed along XIV-XIV line shown in FIG. 13.

The differences between a connecting portion 85D according to the fifth embodiment and the connecting portion 85 according to the first embodiment may be, as shown in FIG. 13 and FIG. 14, a sleeve through-hole 88D, a sleeve insertion hole 89D, a fall prevention unit 92D, a first reinforcing plate 94D, and a second reinforcing plate 95D.

The inner diameter dimension of the sleeve through-hole 88D and the inner diameter dimension of the sleeve insertion hole 89D may be greater than an outer diameter dimension of a first cylindrical projecting portion 942D in the first reinforcing plate 94D and an outer diameter dimension of a second cylindrical projecting portion 952D in the second reinforcing plate 95D, which will be mentioned later.

The fall prevention unit 92D may include a fall prevention unit main body 921D whose dimension in the Y direction is greater than that of the fall prevention unit main body 921.

A first groove portion 922D, a second groove portion 923D, the third groove portion 924, a sleeve loss prevention portion 925D, and a bolt loss prevention portion 926D may be formed in the fall prevention unit main body 921D. The second groove portion 923D may be formed between the first groove portion 922D and the third groove portion 924. Base areas of the first groove portion 922D and the second groove portion 923D may be formed as semicircular arc surfaces.

Dimensions of the first groove portion 922D in the X direction and the Z direction may be approximately equal to the dimensions of the first groove portion 922 according to the first embodiment. A dimension Y41 from the sleeve loss prevention portion 925D to an end surface of the first reinforcing plate 94D on the −Y direction side thereof may be less than the length dimension Y1 of the positioning sleeve 87. In addition, a dimension Y44 from the sleeve loss prevention portion 925D to a first contact surface 943D of the first reinforcing plate 94D, which will be mentioned later, may be greater than the length dimension Y1.

Dimensions of the second groove portion 923D in the X direction and the Z direction may be approximately equal to the dimensions of the second groove portion 923 according to the first embodiment. A dimension Y42 from the bolt loss prevention portion 926D to the first contact surface 943D may be greater than the length dimension Y2 of the bolt 86.

The first and second reinforcing plates 94D and 95D may be formed, for example, from a metal as approximately rectangular plates. Thickness dimensions of the first and second reinforcing plates 94D and 95D may be greater than a thickness Y49 of the upper frames 811 and 821.

First and second plate holes 941D and 951D that pass through the first and second reinforcing plates 94D and 95D, respectively, in the thickness directions thereof may be provided in the centers of the first and second reinforcing plates 94D and 95D, respectively. Inner diameter dimensions of the first and second plate holes 941D and 951D may be greater than the outer diameter dimension of the cylindrical portion 871, within a predetermined range. The "predetermined range" may be a fit tolerance that is compliant with, for example, JIS (Japanese Industrial Standard) specifications, or may be determined in accordance with a category of application determined based on the use of the apparatus, the inner diameter dimensions of the first and second plate holes 941D and 951D, and the outer diameter dimension of the cylindrical portion 871.

First and second cylindrical projecting portions 942D and 952D that project in a cylindrical shape from one surface may be provided in the centers of the first and second reinforcing plates 94D and 95D, respectively. Respective leading end surfaces of the first and second cylindrical projecting portions 942D and 952D may be first and second contact surfaces 943D and 953D formed in planar shapes to fit snugly against each other. The surface roughness, form tolerances, and so on of the first and second contact surfaces 943D and 953D may be managed.

The first and second reinforcing plates 94D and 95D may be anchored to the upper frames 821 and 811 in a state in which the first and second cylindrical projecting portions 942D and 952D are inserted into respective sleeve throughholes 88D and sleeve insertion holes 89D from the interior of the upper frames 821 and 811. The first and second reinforcing plates 94D and 95D may be anchored so that the first and second cylindrical projecting portions 942D and 952D project to the outside from the outside surfaces 852 of the upper frames 821 and 811, respectively, using bolts 949D and 959D that pass through the upper frames 821 and 811.

3.6.3 Operation

Next, operations of the laser apparatus will be described.

Of step 1 to step 5 of the laser apparatus operations described in the first embodiment, steps 1 and 2 are essentially the same as those in the first embodiment, and therefore step 3 to step 5 will be described hereinafter. With respect to step 3 to step 5, items that differ from those in the first embodiment will be described in detail, whereas descriptions of items that are the same as those in the first embodiment will be omitted.

3.6.3.1 Breakdown of Laser Apparatus Housing

The worker may loosen the bolt 86 from the nut 91.

Next, the worker may undo the positioning between the first frame 81 and the second frame 82 in the X direction and the Z direction by moving the first frame 81 in the +Y direction and removing the bolt 86 and the positioning sleeve 87 from the second plate hole 951D.

The worker may then move the bolt 86 and the positioning sleeve 87 in the −Y direction. At this time, because the length dimension Y1 of the positioning sleeve 87 is greater than the dimension Y41 of the first groove portion 922D, the peripheral edge contact portion 872 can make contact with the sleeve loss prevention portion 925D, and the movement of the positioning sleeve 87 can be regulated as a result, before the entire cylindrical portion 871 comes out of the first plate hole 941D. The positioning sleeve 87 can be prevented from coming out of the first plate hole 941D as a result of this regulation of the movement of the positioning sleeve 87. In addition, because the length dimension Y1 of the positioning sleeve 87 is less than the dimension Y44, the cylindrical portion 871 can be suppressed from projecting out from the first contact surface 943D.

Meanwhile, the movement of the bolt 86 is regulated by the bolt head 861 making contact with the bolt loss prevention portion 926D. At this time, because the length dimension Y2 of the bolt 86 is less than the dimension Y42, the male screw portion 862 can be suppressed from projecting out from the first contact surface 943D.

The breakdown of the laser apparatus housing 8 can be completed by the worker performing the above-described operations on all of the connecting portions 85D and separating the first frame 81, the second frame 82, the third frame 83, and the fourth frame 84 from each other.

3.6.3.2 Transport of Laser Apparatus

The worker may transport the respective constituent components of the laser apparatus 3 that has been broken down. The first to fourth frames 81 to 84 can be transported in a state in which the fall prevention unit 92D prevents the positioning sleeve 87 from coming out of the first plate hole 941D and prevents the bolt 86 and the positioning sleeve 87 from falling. In addition, the first to fourth frames 81 to 84 can be transported in a state in which the fall prevention unit 92D suppresses the male screw portion 862 and the cylindrical portion 871 from projecting from the first contact surface 943D.

3.6.3.3 Reconnecting of Laser Apparatus Housing

A worker may reconnect the laser apparatus housing 8 at a transport destination of the laser apparatus 3.

The worker may fit the first to fourth frames 81 to 84 snugly together so that the first contact surface 943D and the second contact surface 953D make contact with each other. After this, the worker may insert the positioning sleeve 87 into the first plate hole 941D and the second plate hole 951D by moving the bolt 86 in the +Y direction using the tool 100. Furthermore, the worker may tighten the bolt 86 into the nut 91. The first frame 81 and the second frame 82 can be positioned in the X, Y, and Z directions as a result of the aforementioned operations. Thereafter, the worker can complete the reconnecting of the laser apparatus housing 8 by performing the above-described operations for all of the connecting portions 85D and attaching pipes and the like (not shown) to the laser apparatus housing 8.

As described above, the laser apparatus 3 may include, for example, the first reinforcing plate 94D that is anchored to the second frame 82 and the second reinforcing plate 95D that is anchored to the first frame 81.

Accordingly, it can be possible to disperse a load that is applied after the bolt 86 is tightened into the nut 91 using the first and second reinforcing plates 94D and 95D. As a result, the sleeve through-hole 88, the sleeve insertion hole 89, or the peripheral edges thereof can be suppressed from deforming, and the positioning accuracy between the first to fourth frames 81 to 84 can be maintained.

The first and second contact surfaces 943D and 953D may be provided in the first and second reinforcing plates 94D and 95D.

Through this, it can be easier to manage the surface roughness, form tolerances, and so on of the first and second contact surfaces 943D and 953D, and can be easier to reproduce the relative positions between the first to fourth frames 81 to 84.

3.7 Variations

Note that the following configurations may be employed as the connecting portions.

3.7.1 First Variation

Figure 15:
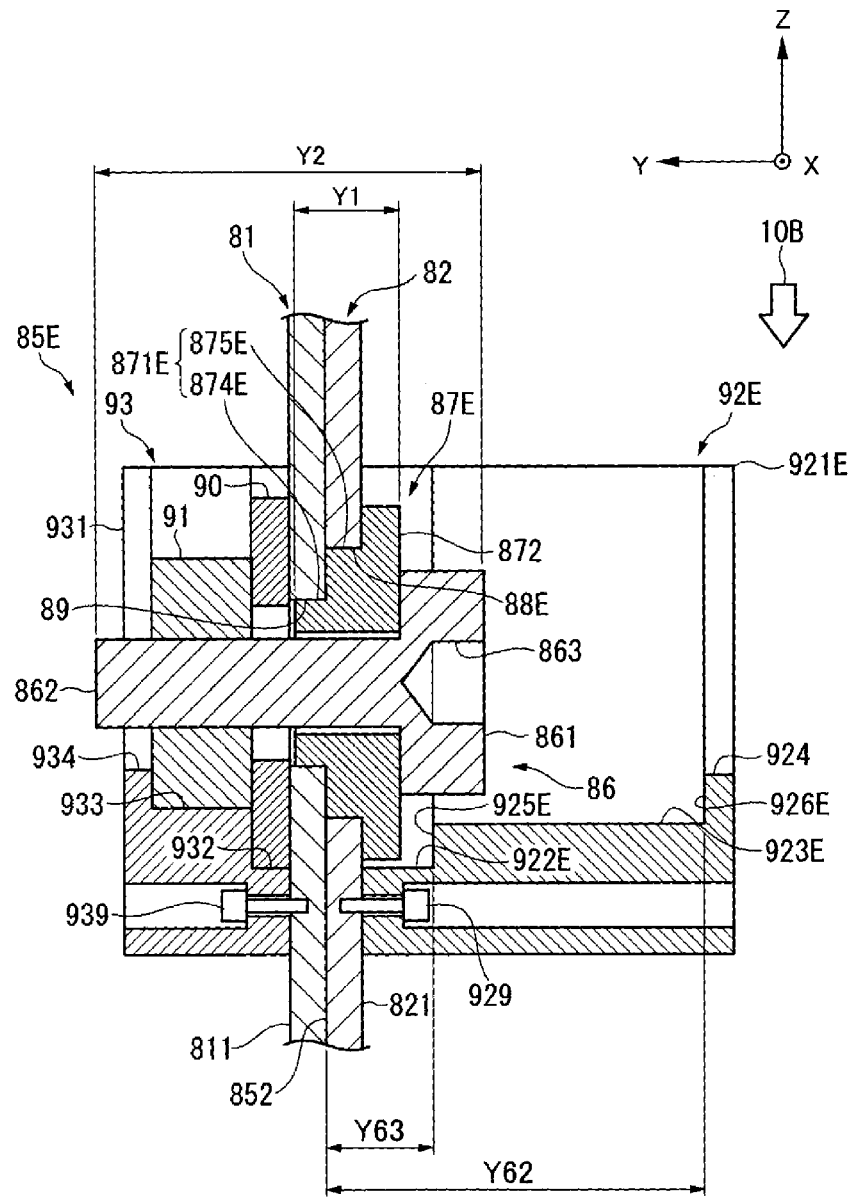
FIG. 15 is a sectional view illustrating a connecting portion according to a first variation.

FIG. 15 is a sectional view illustrating a connecting portion according to a first variation.

The difference between a connecting portion 85E according to the first variation and the connecting portion 85A according to the second embodiment may, as shown in FIG. 15, be a positioning sleeve 87E, a sleeve through-hole 88E, and a fall prevention unit 92E.

The positioning sleeve 87E may include a cylindrical portion 871E and the peripheral edge contact portion 872. The cylindrical portion 871E may include a small diameter portion 874E that has the same diameter dimension as the cylindrical portion 871 of the second embodiment, and a large diameter portion 875E that has a diameter dimension that is greater than the diameter dimension of the small diameter portion 874E. The peripheral edge contact portion 872 may be connected to the large diameter portion 875E. The thickness (that is, the dimension in the Z direction) of the large diameter portion 875E may be greater than the thickness of the small diameter portion 874E and may be less than the thickness of the peripheral edge contact portion 872.

The inner diameter dimension of the sleeve through-hole 88E may be greater than the outer diameter dimension of the large diameter portion 875E.

The fall prevention unit 92E may include a fall prevention unit main body 921E, a first groove portion 922E, a second groove portion 923E, the third groove portion 924, a sleeve loss prevention portion 925E, and a bolt loss prevention portion 926E. The second groove portion 923E may be formed between the first groove portion 922E and the third groove portion 924. Base areas of the first groove portion 922E and the second groove portion 923E may be formed as semicircular arc surfaces.

Dimensions of the first groove portion 922E and the second groove portion 923E in the X direction and the Z direction may be approximately equal to the dimensions of the first groove portion 922A and the second groove portion 923A according to the second embodiment. In addition, a dimension Y63 from the sleeve loss prevention portion 925E to the outside surface 852 may be greater than the length dimension Y1 of the positioning sleeve 87E. A dimension Y62 from the bolt loss prevention portion 926E to the outside surface 852 may be smaller than the length dimension Y2 of the bolt 86.

3.7.2 Second Variation

Figure 16:
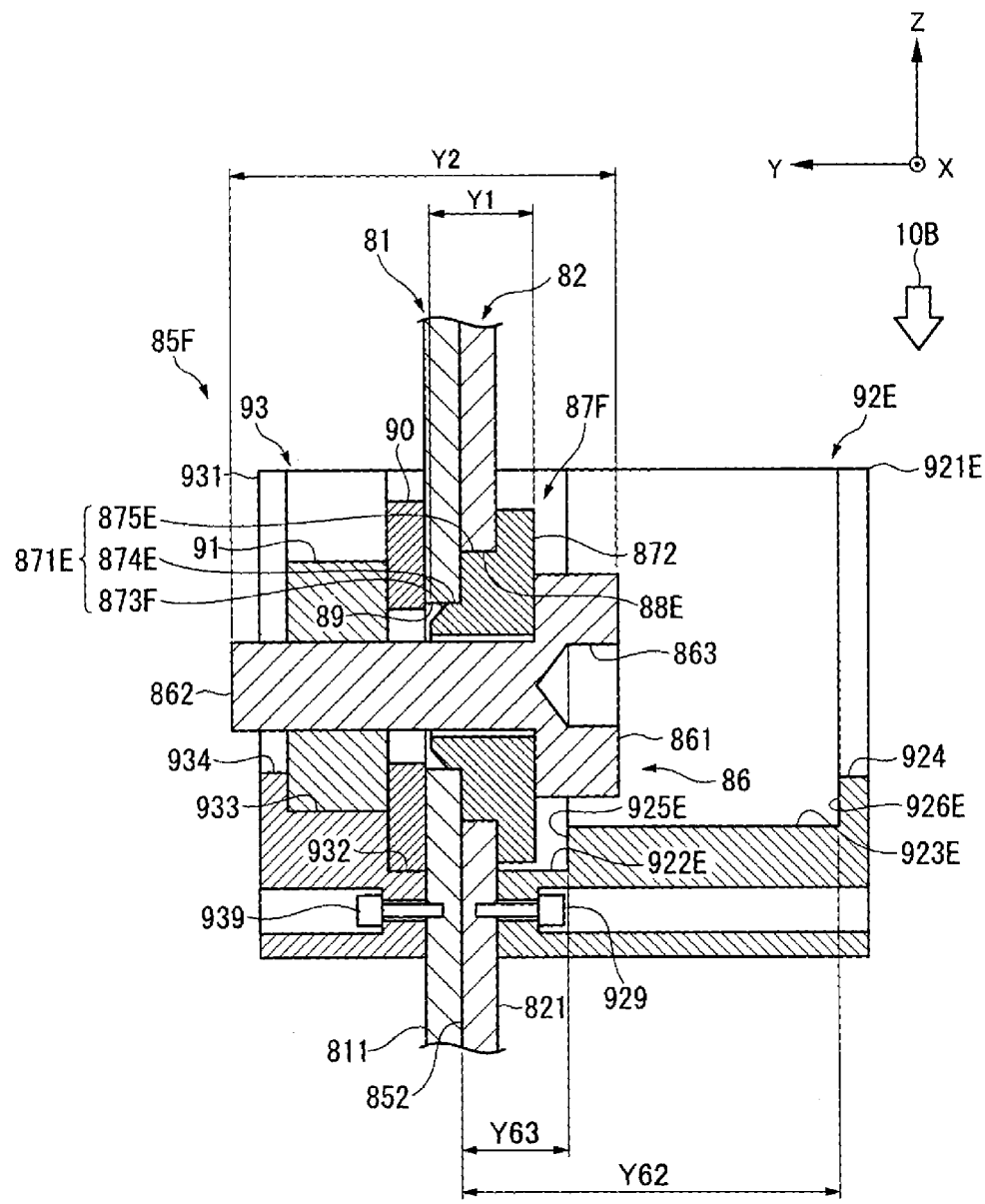
FIG. 16 is a sectional view illustrating a connecting portion according to a second variation.

FIG. 16 is a sectional view illustrating a connecting portion according to a second variation.

The difference between a connecting portion 85F according to the second variation and the connecting portion 85E according to the first variation may, as shown in FIG. 16, be the positioning sleeve 87F.

The positioning sleeve 87F may correspond to the small diameter portion 874E of the first variation, where a sloped surface portion 873F has been provided on the leading end side thereof. The sloped surface portion 873F may be formed having an approximately conical surface shape that is sloped to narrow moving away from the peripheral edge contact portion 872. According to such a configuration, the outer diameter dimension of the sloped surface portion 873F is less than the inner diameter dimension of the sleeve insertion hole 89, and thus the positioning sleeve 87F can enter into the sleeve insertion hole 89 easily.

3.7.3 Third Variation

Figure 17:
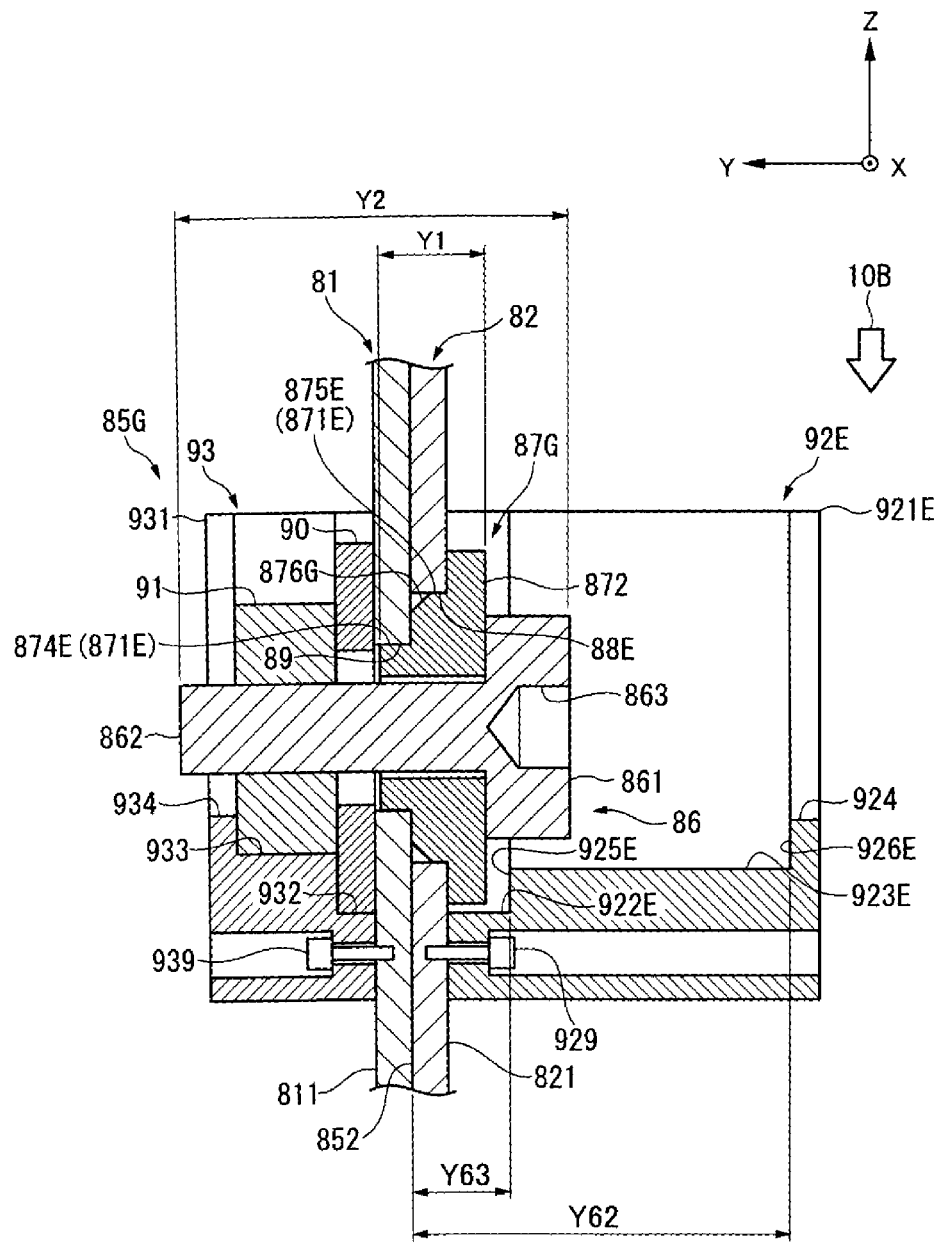
FIG. 17 is a sectional view illustrating a connecting portion according to a third variation.

FIG. 17 is a sectional view illustrating a connecting portion according to a third variation.

The difference between a connecting portion 85G according to the third variation and the connecting portion 85E according to the first variation may, as shown in FIG. 17, be a positioning sleeve 87G.

The positioning sleeve 87G may correspond to the large diameter portion 875E of the first variation, where a sloped surface portion 876G has been provided on the leading end side thereof. The sloped surface portion 876G may be formed having an approximately conical surface shape that is sloped to narrow moving away from the peripheral edge contact portion 872. According to such a configuration, the outer diameter dimension of the sloped surface portion 876G is less than the inner diameter dimension of the sleeve through-hole 88E, and thus the positioning sleeve 87G can enter into the sleeve through-hole 88E easily.

3.7.4 Fourth Variation

Figure 18:
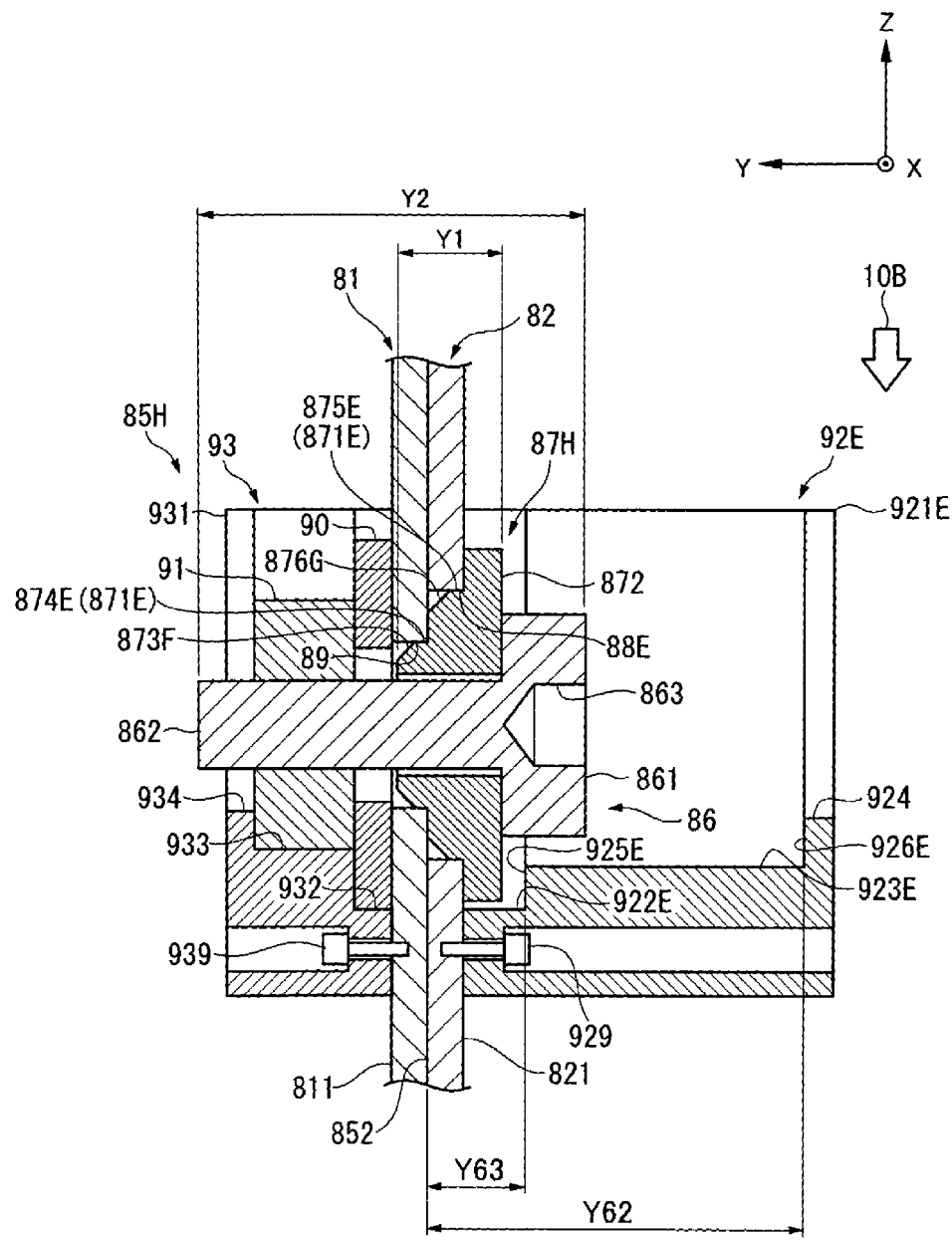
FIG. 18 is a sectional view illustrating a connecting portion according to a fourth variation.

FIG. 18 is a sectional view illustrating a connecting portion according to a fourth variation.

The difference between a connecting portion 85H according to the fourth variation and the connecting portion 85G according to the third variation may, as shown in FIG. 18, be a positioning sleeve 87H.

The positioning sleeve 87H may correspond to the cylindrical portion 871E of the first variation, where the sloped surface portion 873F of the second variation and the sloped surface portion 876G of the third variation have been provided therein. According to such a configuration, the same effects as the second variation and the third variation can be achieved.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements."

Further, the modifier "one (a/an)" should be interpreted as "at least one" or "one or more."

What is claimed is:

1. A laser apparatus comprising:
   a laser system;
   a pair of frames, one frame being provided with a sleeve through-hole and the other fame being provided with a sleeve insertion portion;
   a bolt;
   a positioning sleeve, formed in an approximately cylindrical shape into the interior of which the bolt can be inserted, configured to position the pair of frames by passing through the sleeve through-hole and being inserted into the sleeve insertion portion;
   a female screw portion, provided in the other frame, into which the bolt is screwed; and
   a fall prevention unit, provided in the one frame, configured to prevent the bolt and the positioning sleeve from falling,
   wherein the laser system includes a plurality of laser system modules, at least one of the laser system modules are mounted in the one frame; and at least one other of the laser system modules are mounted in the other frame,
   wherein the fall prevention unit includes:
   a sleeve loss prevention portion configured to prevent the positioning sleeve from coming out of the sleeve through-hole in a state in which the positioning sleeve does not project from the one frame; and
   a bolt loss prevention portion configured to prevent the bolt from coming out of the sleeve through-hole in a state in which the bolt does not project from the one frame.

2. A laser apparatus comprising:
   a laser system;
   a pair of frames, one frame being provided with a sleeve through-hole and the other fame being provided with a sleeve insertion portion;
   a bolt;
   a positioning sleeve, formed in an approximately cylindrical shape into the interior of which the bolt can be inserted, configured to position the pair of frames by passing through the sleeve through-hole and being inserted into the sleeve insertion portion;
   a female screw portion, provided in the other frame, into which the bolt is screwed; and
   a fall prevention unit, provided in the one frame, configured to prevent the bolt and the positioning sleeve from falling,
   wherein the laser system includes a plurality of laser system modules, at least one of the laser system modules are mounted in the one frame; and at least one other of the laser system modules are mounted in the other frame, and
   the laser apparatus further comprises:
   a first reinforcing plate having a first plate hole through which the positioning sleeve can pass and that is anchored to the one frame; and
   a second reinforcing plate having a second plate hole through which the positioning sleeve can pass and that is anchored to the other frame.

3. The laser apparatus according to claim 2,
   wherein the sleeve insertion portion is formed in the shape of a hole through which the positioning sleeve is passed; and
   the female screw portion is configured of a nut into which the bolt is screwed, and
   wherein the first reinforcing plate includes:
   a first cylindrical projecting portion, having an approximately cylindrical shape, that can pass through the sleeve through-hole and that is configured to project from the one frame toward the other frame; and
   a first contact surface provided at the leading end of the first cylindrical projecting portion, and
   wherein the second reinforcing plate includes:
   a second cylindrical projecting portion, having an approximately cylindrical shape, that can pass through the sleeve insertion portion and that is configured to project from the other frame toward the one frame; and
   a second contact surface, provided at the leading end of the second cylindrical projecting portion, that is configured to make contact with the first contact surface.

\* \* \* \* \*